(12) United States Patent
Ishiguro et al.

(10) Patent No.: US 10,026,929 B2
(45) Date of Patent: Jul. 17, 2018

(54) ORGANIC EL DISPLAY DEVICE

(71) Applicant: FUJIFILM Corporation, Tokyo (JP)

(72) Inventors: Makoto Ishiguro, Kanagawa (JP); Akira Yamamoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/339,104

(22) Filed: Oct. 31, 2016

(65) Prior Publication Data

US 2017/0047555 A1   Feb. 16, 2017

Related U.S. Application Data

(63) Continuation of application No. PCT/JP2015/062994, filed on Apr. 30, 2015.

(30) Foreign Application Priority Data

May 1, 2014 (JP) ................................. 2014-094669

(51) Int. Cl.
| | |
|---|---|
| *H01L 51/52* | (2006.01) |
| *B32B 7/02* | (2006.01) |
| *B32B 7/12* | (2006.01) |
| *G02B 5/30* | (2006.01) |

(52) U.S. Cl.
CPC ............ *H01L 51/5293* (2013.01); *B32B 7/02* (2013.01); *B32B 7/12* (2013.01); *G02B 5/3016* (2013.01);
(Continued)

(58) Field of Classification Search
None
See application file for complete search history.

(56) References Cited

U.S. PATENT DOCUMENTS

2003/0016446 A1    1/2003   Yano et al.
2008/0266493 A1*  10/2008   Yonezawa ............... C08L 25/10
                                                              349/96
(Continued)

FOREIGN PATENT DOCUMENTS

JP    09-127885 A      5/1997
JP    2003-029038 A    1/2003
(Continued)

OTHER PUBLICATIONS

Notification of Reasons for Refusal, issued by the Japanese Patent Office dated Jun. 6, 2017, in connection with corresponding Japanese Patent Application No. 2016-516410.
(Continued)

*Primary Examiner* — Michelle Mandala
(74) *Attorney, Agent, or Firm* — Edwards Neils, LLC; Jean C. Edwards, Esq.

(57) ABSTRACT

The present invention provides an organic EL display device in which external light reflection and tinting are suppressed when viewed from a front and an oblique direction, and includes a polarizer, a first optically anisotropic layer, a λ/4 plate, and an organic EL display panel in this order from a viewing side, where an angle formed between an absorption axis of the polarizer and an in-plane slow axis of the λ/4 plate is within a range of 45±3°, an Nz factor of the first layer is −0.1 or more and 1.1 or less, the absorption axis of the polarizer is parallel with or orthogonal to the in-plane slow axis of the first layer, and Re(550), which is an in-plane retardation value of the first layer measured at a wavelength of 550 nm, satisfies the following Equation (X).

100 nm≤Re(550)≤450 nm.   Equation (X)

19 Claims, 3 Drawing Sheets

(52) U.S. Cl.
CPC ........ *G02B 5/3041* (2013.01); *H01L 51/5281* (2013.01); *B32B 2307/412* (2013.01); *B32B 2307/418* (2013.01); *B32B 2307/42* (2013.01); *B32B 2457/206* (2013.01)

(56) References Cited

U.S. PATENT DOCUMENTS

2013/0093968 A1* 4/2013 Yanai .................. G02F 1/13363
                                                            349/15
2014/0247487 A1* 9/2014 Jeon ..................... G02B 5/3083
                                                           359/489.07

FOREIGN PATENT DOCUMENTS

| JP | 2003-075635 A | 3/2003 |
| JP | 2003-332068 A | 11/2003 |
| JP | 2007-108732 A | 4/2007 |
| JP | 2010-244038 A | 10/2010 |
| JP | 2012-068438 A | 4/2012 |
| WO | 2009/028428 A1 | 3/2009 |
| WO | 2010/058633 A1 | 5/2010 |
| WO | 2013/137123 A1 | 9/2013 |
| WO | 2014/156311 A1 | 10/2014 |
| WO | 2014/157079 A1 | 10/2014 |

OTHER PUBLICATIONS

International Preliminary Report on Patentability issued by WIPO dated Nov. 10, 2016, in connection with International Patent Application No. PCT/JP2015/062994.

International Search Report issued in PCT/JP2015/062994 dated Aug. 4, 2015.

* cited by examiner

ORGANIC EL DISPLAY DEVICE

CROSS-REFERENCE TO RELATED APPLICATIONS

This application is a Continuation of PCT International Application No. PCT/JP2015/062994 filed on Apr. 30, 2015, which was published under PCT Article 21(2) in Japanese, and which claims priority under 35 U.S.C. § 119(a) to Japanese Patent Application No. 2014-094669 filed on May 1, 2014. The above applications are hereby expressly incorporated by reference, in their entirety, into the present application.

BACKGROUND OF THE INVENTION

1. Field of the Invention

The present invention relates to an organic EL display device, particularly to an organic EL display device having a predetermined optically anisotropic layer between a polarizer and a λ/4 plate.

2. Description of the Related Art

Conventionally, in order to suppress an adverse effect due to external light reflection, a circularly polarizing plate has been used for an organic EL (electroluminescence) display device or the like. As the circularly polarizing plate, for example, as described in JP1997-127885A (JP-H09-127885A), an embodiment of a combination of a ¼ wavelength plate (λ/4 plate) and a polarizer has been disclosed.

SUMMARY OF THE INVENTION

On the other hand, in recent years, it has been required to further improve viewing angle properties of a display device represented by an organic EL display device. More specifically, it is required to further reduce external light reflection and tinting in an organic EL display device having a circularly polarizing plate when viewed from an oblique direction.

When investigations regarding external light reflection properties of the organic EL display device including the circularly polarizing plate described in JP1997-127885A (JP-H09-127885A) were conducted by the present inventors, external light reflection was sufficiently suppressed when the organic EL display device was viewed from a front direction but suppression of external light reflection and tinting did not reach a recently required level when the organic EL display device was viewed from an oblique direction and a further improvement is required.

The present invention has been made in consideration of the above circumstances and an object thereof is to provide an organic EL display device in which external light reflection and tinting are further suppressed not only when viewed from a front direction but also when viewed from an oblique direction.

As a result of conducting intensive investigations regarding the problems of the related art, the present inventors have found that the above problems can be solved by arranging a predetermined optically anisotropic layer between a polarizer and a λ/4 plate.

That is, it has been found that the above object can be achieved by the following configurations.

(1) An organic EL display device comprising: a polarizer, a first optically anisotropic layer, a λ/4 plate, and an organic EL display panel in this order from a viewing side, in which an angle formed between an absorption axis of the polarizer and an in-plane slow axis of the λ/4 plate is within a range of 45±3°, an Nz factor of the first optically anisotropic layer is −0.1 or more and 1.1 or less, in a case in which the Nz factor of the first optically anisotropic layer is 0.5 or more and 1.1 or less, the polarizer and the first optically anisotropic layer are arranged such that the absorption axis of the polarizer is parallel with the in-plane slow axis of the first optically anisotropic layer, in a case in which the Nz factor of the first optically anisotropic layer is −0.1 or more and less than 0.5, the polarizer and the first optically anisotropic layer are arranged such that the absorption axis of the polarizer is orthogonal to the in-plane slow axis of the first optically anisotropic layer, and Re(550), which is an in-plane retardation value of the first optically anisotropic layer measured at a wavelength of 550 nm, satisfies the following Equation (X).

$$100 \text{ nm} \leq Re(550) \leq 450 \text{ nm} \quad \text{Equation (X)}$$

(2) The organic EL display device according to (1), in which an average refractive index of the first optically anisotropic layer and an average refractive index of the polarizer satisfy a relationship of the following Equation (Y).

$$\text{Average refractive index of first optically anisotropic layer} - \text{Average refractive index of polarizer} \geq 0.03 \quad \text{Equation (Y)}$$

(3) The organic EL display device according to (1) or (2), in which the first optically anisotropic layer includes a liquid crystal compound.

(4) The organic EL display device according to any one of (1) to (3), in which the Nz factor of the first optically anisotropic layer is 0.5 or more and 1.1 or less.

(5) The organic EL display device according to (4), in which the first optically anisotropic layer includes a rod-like liquid crystal compound.

(6) The organic EL display device according to any one of (1) to (3), in which the Nz factor of the first optically anisotropic layer is −0.1 or more and less than 0.5.

(7) The organic EL display device according to (6), in which the first optically anisotropic layer includes a disk-like liquid crystal compound.

(8) The organic EL display device according to any one of (1) to (7), in which the λ/4 plate exhibits reverse wavelength dispersibility.

(9) The organic EL display device according to any one of (1) to (8), in which the λ/4 plate includes a liquid crystal compound.

(10) The organic EL display device according to any one of (1) to (9), further comprising: a second optically anisotropic layer between the λ/4 plate and the organic EL display panel, in which Re(550), which is an in-plane retardation value of the second optically anisotropic layer measured at a wavelength of 550 nm, is 0 to 10 nm, and Rth(550), which is a retardation value of the second optically anisotropic layer in a thickness direction measured at a wavelength of 550 nm, is −90 to −40 nm.

According to the present invention, it is possible to provide an organic EL display device in which external light

DESCRIPTION OF THE PREFERRED EMBODIMENTS

Figure 1:
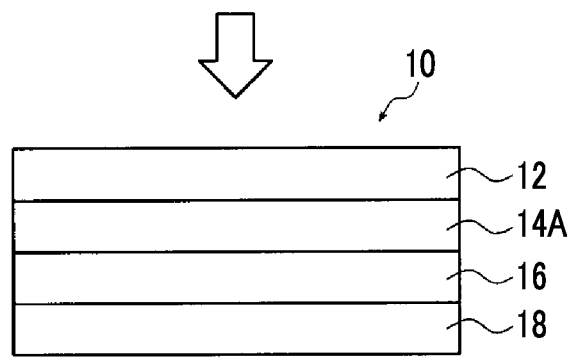
FIG. 1 is a cross-sectional view showing a first embodiment of an organic EL display device of the present invention.

Hereinafter, the present invention will be described in detail. The numerical range which is shown by "to" used in the present specification means the range including the numerical values described before and after "to" as the lower limit and the upper limit, respectively. First, terms used in the present specification will be described.

Re(λ) and Rth(λ) represent an in-plane retardation and a retardation in a thickness direction at a wavelength λ, respectively. Re(λ) is measured by making light having a wavelength of λ nm incident to a film in a normal direction using KOBRA 21ADH or WR (manufactured by OJI SCIENCE INSTRUMENTS). Upon selecting the measurement wavelength λ nm, a wavelength-selecting filter can be manually exchanged or the measurement value can be changed by programming to conduct measurement. In the case in which the film to be measured is expressed as a monoaxial or biaxial refractive index ellipsoid, Rth(λ) is calculated as follows. Additionally, this measuring method is partly utilized in measuring the average tilt angle of a liquid crystal compound and the average tilt angle on the opposite side.

Rth(λ) is calculated with KOBRA 21ADH or WR based on the retardation values obtained by measuring Re(λ) above at a total of 6 points in directions tilted at intervals of 10° from the normal direction of the film up to 50° on one side relative to the normal direction of the film around an in-plane slow axis (determined by KOBRA 21ADH or WR) as a tilt axis (rotation axis) (in the case in which the film does not have a slow axis, an arbitrary in-plane direction of the film may be taken as the rotation axis) by making light having a wavelength of λ nm incident to the film from each of the tilted directions, a hypothetical value of average refractive index, and an inputted film thickness value. In the above description, in a case of a film that has a direction in which the retardation value thereof is zero at a certain tilt angle relative to the in-plane slow axis thereof in the normal direction taken as a rotation axis, the retardation value at a tilt angle larger than the tilt angle is converted into the corresponding negative value and then calculated by KOBRA 21ADH or WR. Additionally, with the slow axis taken as the tilt axis (rotation axis) (in the case in which the film does not have a slow axis, an arbitrary in-plane direction of the film may be taken as the rotation axis), the retardation values are measured in two arbitrary tilted directions and, based on the above values, the hypothetical value of average refractive index, and the inputted film thickness, Rth can be also calculated according to the following Equations (A) and (B).

$$Re(\theta) = \left[ nx - \frac{(ny \times nz)}{\sqrt{\left(ny\sin\left(\sin^{-1}\left(\frac{\sin(-\theta)}{nx}\right)\right)\right)^2 + \left(nz\cos\left(\sin^{-1}\left(\frac{\sin(-\theta)}{nx}\right)\right)\right)^2}} \right] \times \frac{d}{\cos\left(\sin^{-1}\left(\frac{\sin(-\theta)}{nx}\right)\right)} \quad \text{Equation (A)}$$

Re(θ) above represents the retardation value in the direction tilted by an angle θ from the normal direction. nx in the Equation (A) represents the refractive index in the in-plane slow axis direction. ny represents the refractive index in the direction orthogonal to the in-plane nx, and nz represents the refractive index in the direction orthogonal to nx and ny. d represents the thickness of the measured film.

$$Rth = ((nx+ny)/2 - nz) \times d \quad \text{Equation (B)}$$

In the case in which the film to be measured cannot be expressed as a monoaxial or biaxial refractive index ellipsoid, that is, in which the film to be measured has no so-called optical axis, Rth(λ) is calculated as follows. Rth(λ) is calculated with KOBRA 21ADH or WR based on the retardation values obtained by measuring Re (λ) above at a total of 11 points in directions tilted at intervals of 10° from −50° up to +50° relative to the normal direction of the film around an in-plane slow axis (determined by KOBRA 21ADH or WR) as a tilt axis (rotation axis) by making light having a wavelength of λ nm incident to the film from each of the tilted directions, a hypothetical value of average refraction index and an inputted film thickness value. Also, in the above measurement, the hypothetical value of average refractive index is available from values listed in catalogues of various optical films in Polymer Handbook (JOHN WILEY & SONS, INC.). Those having the average refractive indices unknown can be measured using an ABBE refract meter. The average refractive indices of some major optical films are listed below: cellulose acylate (1.48), cycloolefin polymer (1.52), polycarbonate (1.59), polymethylmethacrylate (1.49) and polystyrene (1.59). KOBRA 21ADH or WR calculates nx, ny and nz, by inputting the hypothetical values of these average refractive indices and the film thickness. Base on the relational expression of Nz=(nx−nz)/(nx−ny) from thus-calculated nx, ny and nz, an Nz factor is further calculated.

In the present specification, the term "visible light" refers to light having a wavelength of 380 nm to 780 nm. In the present specification, unless particularly otherwise described, the measurement wavelength is 550 nm.

In addition, in the present specification, angles (for example, an angle such as "90°"), and relationships thereof (for example, "orthogonal", "parallel", "45°", and "90°") include errors within a range acceptable in the technical field to which the present invention belongs. For example, the angles are within a range of an exact angle ±10° or less, and the error with the exact angle is preferably 5° or less and more preferably 3° or less. For example, in the case of being orthogonal, the error may be within a range of 90°±10° (80 to 100°).

One characteristic of the organic EL display device of the present invention is arranging an optically anisotropic layer exhibiting a predetermined in-plane retardation value between the polarizer and the λ/4 plate as described above. Considering a function as a circularly polarizing plate, it is desirable that an angle formed between the absorption axis of the polarizer and the in-plane slow axis of the λ/4 plate is 45°. On the other hand, even in the case in which the polarizer and the λ/4 plate are arranged such that the angle formed between the absorption axis of the polarizer and the in-plane slow axis of the λ/4 plate is 45° when the organic EL display device is viewed from the front direction, the angle formed between the absorption axis of the polarizer and the in-plane slow axis of the λ/4 plate is shifted from 45° when the organic EL display device is viewed from the oblique direction. Thus, the effect of suppressing external light reflection and tinting is reduced. In contrast, surprisingly, when the optically anisotropic layer exhibiting a predetermined in-plane retardation value is arranged at a predetermined position, it is found that the angle formed between the absorption axis of the polarizer and the in-plane slow axis of the λ/4 plate is prevented from being shifted from an ideal value when the organic EL display device is viewed from the oblique direction, and as a result, the occurrence of external light reflection and tinting is suppressed to improve visibility.

First Embodiment

Hereinafter, a first embodiment of an organic EL display device of the present invention will be described with reference to the drawings. FIG. 1 is a cross-sectional view showing a first embodiment of an organic EL display device of the present invention. Since drawings in the present invention are schematic views, a relationship of thickness between the respective layers or a positional relationship between the respective layers does not necessarily agree with the real one. The same will be applied to the following drawings.

An organic EL display device 10 has a polarizer 12, a first optically anisotropic layer 14A, a λ/4 plate 16, and an organic EL display panel 18 in this order from the viewing side. In FIG. 1, the organic EL display device 10 is viewed from a direction of a void arrow. The polarizer 12, the first optically anisotropic layer 14A, and the λ/4 plate 16 configure a so-called circularly polarizing plate.

Figure 2:
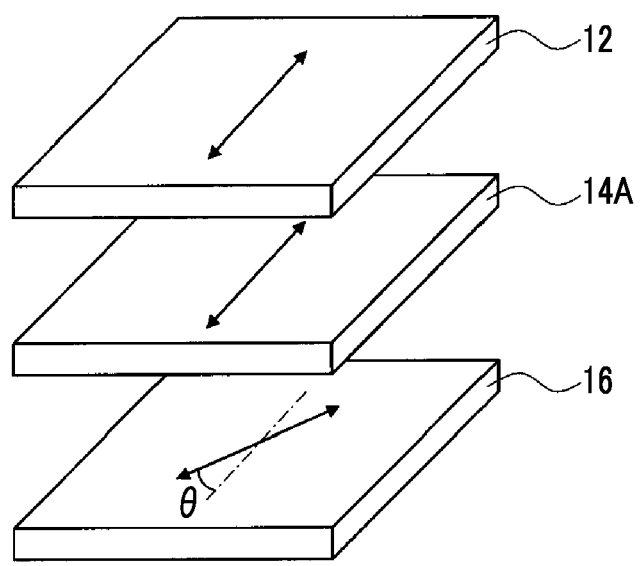
FIG. 2 is a view showing a relationship among an absorption axis of a polarizer, an in-plane slow axis of a first optically anisotropic layer, and an in-plane slow axis of a λ/4 plate in the first embodiment of the organic EL display device of the present invention.

FIG. 2 shows a relationship among an absorption axis of the polarizer 12, an in-plane slow axis of the first optically anisotropic layer 14A, and an in-plane slow axis of the λ/4 plate 16. In FIG. 2, the arrow in the polarizer 12 represents a direction of the absorption axis, the arrows in the first optically anisotropic layer 14A and the λ/4 plate 16 represent directions of the in-plane slow axes in the respective layers.

Hereinafter, each member included in the organic EL display device 10 will be described in detail.

(Polarizer)

The polarizer 12 may be a member having a function of converting light into linearly polarized light (linear polarizer) and an absorption type polarizer may be mainly used.

As the absorption type polarizer, an iodine-based polarizer, a dye-based polarizer using a dichroic dye, a polyene-based polarizer, and the like can be used. In the iodine-based polarizer and the dye-based polarizer, there are a coating type polarizer and a stretching type polarizer and any type of polarizer may be used. However, a polarizer that is produced by adsorbing iodine or a dichroic dye to polyvinyl alcohol and stretching the polyvinyl alcohol film is preferable.

In addition, as a method of obtaining a polarizer through stretching and dying in a state of a laminated film in which a polyvinyl alcohol layer is formed on a substrate, methods disclosed in JP5048120B, JP5143918B, JP5048120B, JP4691205B, JP4751481B, and JP4751486B may be used and a known technology relevant to these polarizers may be preferably used.

Among these, from the viewpoint of handleability, a polarizer including a polyvinyl alcohol-based resin (a polymer including —$CH_2$—CHOH— as a repeating unit, particularly, at least one selected from the group consisting of polyvinyl alcohols and ethylene/vinyl alcohol copolymers is preferable) is preferable.

The thickness of the polarizer 12 is not particularly limited and from the viewpoint of excellent handleability and optical properties, the thickness is preferably 35 μm or less, more preferably 3 to 25 μm, and still more preferably 4 to 15 μm. When the thickness is within the above range, the thickness of an image display device can be reduced.

(First Optically Anisotropic Layer 14A)

The first optically anisotropic layer 14A is a layer that is arranged between the polarizer 12 and the λ/4 plate 16 which will be described later. By providing this layer, when the organic EL display device is viewed from an oblique direction, external light reflection and tinting are further suppressed.

As shown in FIG. 2, the polarizer and the first optically anisotropic layer are arranged such that the absorption axis of the polarizer 12 is parallel with the in-plane slow axis of the first optically anisotropic layer 14A. The definition of parallel is as described above.

Re(550), which is an in-plane retardation value of the first optically anisotropic layer 14A measured at a wavelength of 550 nm, satisfies the following Equation (X).

$$100 \text{ nm} \leq Re(550) \leq 450 \text{ nm} \qquad \text{Equation (X)}$$

Within the above range, from the viewpoint of further suppressing external light reflection and tinting when the organic EL display device is viewed from the oblique direction (hereinafter, simply referred to as "from the viewpoint of further improving the effect of the present invention"), Re(550) preferably satisfies Equation (X1) and more preferably satisfies Equation (X2).

$$150 \text{ nm} \leq Re(550) \leq 400 \text{ nm} \qquad \text{Equation (X1)}$$

$$200 \text{ nm} \leq Re(550) \leq 300 \text{ nm} \qquad \text{Equation (X2)}$$

In the case in which Re(550) is less than 100 nm and more than 450 nm, when the organic EL display device is viewed from the oblique direction, external light reflection and/or tinting is significant.

The first optically anisotropic layer 14A may exhibit forward wavelength dispersibility (property that the in-plane retardation value decreases as the measurement wavelength increases) or may exhibit reverse wavelength dispersibility (property that the in-plane retardation value increases as the measurement wavelength increases). However, from the viewpoint of further improving the effect of the present invention, it is preferable that the first optically anisotropic layer exhibits reverse wavelength dispersibility. Herein, the wavelength dispersibility is preferably exhibited in a visible light region.

In order for the in-plane retardation value of the first optically anisotropic layer 14A to have an appropriate reverse wavelength dispersibility, specifically, the first optically anisotropic layer 14A preferably satisfy the relationship of the following Equation (I) and more preferably satisfy the relationships of Equations (I) and (II).

$$0.70 \leq Re(450\ nm)/Re(550\ nm) \leq 0.88 \quad \text{Equation (I):}$$

$$1.01 \leq Re(650\ nm)/Re(550\ nm) \leq 1.30 \quad \text{Equation (II):}$$

Re(450) and Re(650) above represent in-plane retardation values of the first optically anisotropic layer 14A which are respectively measured at wavelengths of 450 nm and 650 nm. The Nz factor of the first optically anisotropic layer 14A is 0.5 or more and 1.1 or less and preferably 0.65 to 1.05. A method of calculating the Nz factor is as described above.

The first optically anisotropic layer 14A is preferably a so-called A plate (particularly, a positive A plate).

Rth(550), which is a retardation value of the first optically anisotropic layer 14A in the thickness direction measured at a wavelength of 550 nm, is preferably 0 to 270 nm, more preferably 0 to 230 nm, and still more preferably 0 to 220 nm from the viewpoint of further improving the effect of the present invention.

The average refractive index of the first optically anisotropic layer 14A and the average refractive index of the polarizer 12 preferably satisfy the relationship of the following Equation (Y) from the viewpoint of further improving the effect of the present invention.

Average refractive index of first optically anisotropic layer−Average refractive index of polarizer≥0.03     Equation (Y)

The Equation (Y) indicates that a difference between the average refractive index of the first optically anisotropic layer 14A and the average refractive index of the polarizer 12 is 0.03 or more.

In the case in which the first optically anisotropic layer 14A includes a liquid crystal compound (for example, in the case of a layer formed by fixing the alignment of a liquid crystal compound), the average refractive index is preferably about 1.53 to 1.70.

The average refractive index may be measured by using ellipsometers AEP-100 (manufactured by SHIMADZU CORPORATION), M150 and M520 (manufactured by JASCO CORPORATION), and ABR10A (manufactured by UNIOPT CORPORATION, LTD.). Unless otherwise specified in the present specification, the average refractive index is measured by using an ellipsometer M520 (manufactured by JASCO CORPORATION).

The first optically anisotropic layer 14A includes a liquid crystal compound. More specifically, the first optically anisotropic layer 14A corresponds to a layer including a liquid crystal compound with homogeneous alignment. The homogeneous alignment refers to an alignment state in which the long axis direction formed by a liquid crystal compound is aligned in parallel with the surface. However, as long as predetermined properties such as the above in-plane retardation value are satisfied, the layer may be constituted of another material. For example, the layer may be formed of a polymer film (particularly, a stretched polymer film).

The type of the liquid crystal compound is not particularly limited and can be classified into a rod-like type (rod-like liquid crystal compound) and a disk-like type (disk-like liquid crystal compound, discotic liquid crystal compound) depending on the shape. Further, each type includes a low molecular type and a high molecular type, respectively. The "high molecular type" generally means a polymer having a degree of polymerization of 100 or more (Kobunshi Butsuri Souten-i Dainamikusu (Polymer Physics and Phase Transition Dynamics), written by Masao Doi, p. 2, Iwanami Shoten, Publishers, 1992). In the present invention, any liquid crystal compound may be used. Two or more rod-like liquid crystal compounds, two or more disk-like liquid crystal compounds, or a mixture of rod-like and disk-like liquid crystal compounds may be used.

As the rod-like liquid crystal compound, for example, liquid crystal compounds described in claim 1 of JP1999-513019A (JP-H11-513019A) and paragraphs "0026" to "0098" of JP2005-289980A may be preferably used. As the disk-like liquid crystal compound, for example, liquid crystal compounds described in paragraphs "0020" to "0067" of JP2007-108732A and paragraphs "0013" to "0108" of JP 2010-244038A may be preferably used. However, there is no limitation thereto.

Among these, from the viewpoints of more easily controlling the above Nz factor or the like and further improving the effect of the present invention, as the liquid crystal compound included in the first optically anisotropic layer 14A, a rod-like liquid crystal compound is preferable.

It is more preferable that the first optically anisotropic layer 14A is formed using a liquid crystal compound (rod-like liquid crystal compound or disk-like liquid crystal compound) having a polymerizable group because a temperature change or humidity change of optical properties may be reduced. A mixture of two or more liquid crystal compounds may be used. In such a case, at least one liquid crystal compound preferably has two or more polymerizable groups.

That is, it is preferable that the first optically anisotropic layer 14A is a layer that is formed by fixing a rod-like liquid crystal compound or disk-like liquid crystal compound having a polymerizable group through polymerization or the like. In such a case, after the layer is formed, crystallinity does not need to be exhibited any more.

The type of the polymerizable group included in the rod-like liquid crystal compound or disk-like liquid crystal compound is not particularly limited and a functional group capable of causing an addition polymerization reaction is preferable and a polymerizable ethylenically unsaturated group or a ring polymerizable group is preferable. More specifically, a (meth)acryloyl group, a vinyl group, a styryl group, an allyl group, and the like are preferable and a (meth)acryloyl group is more preferable. Note that the (meth)acryloyl group encompasses both methacryloyl group and acryloyl group.

A method of forming the first optically anisotropic layer 14A is not particularly limited and known methods may be used.

For example, the first optically anisotropic layer 14A may be produced by applying a composition for forming a first optically anisotropic layer including a liquid crystal compound having a polymerizable group (hereinafter, also simply referred to as a "composition") to the polarizer 12 to form a coating film, and subjecting the obtained coating film to a curing treatment (ultraviolet irradiation (light irradiation treatment) or heating treatment).

The application of the composition may be carried out by a known method (for example, a wire-bar coating method, an extrusion coating method, a direct gravure coating method, a reverse gravure coating method and a die coating method).

The composition may include components other than the above liquid crystal compound.

For example, the composition may include a polymerization initiator. The polymerization initiator to be used is selected according to the reaction system and examples thereof include a thermal polymerization initiator and a photopolymerization initiator. For example, examples of the photopolymerization initiator include an α-carbonyl compound, acyloin ether, an α-hydrocarbon substituted aromatic acyloin compound, polynuclear quinone compounds, and a combination of triarylimidazole dimer and p-aminophenylketone.

The amount of the polymerization initiator used is preferably 0.01 to 20% by mass and more preferably 0.5 to 5% by mass with respect to the total solid content of the composition.

In addition, the composition may include a polymerizable monomer from the viewpoint of evenness of the coating film and the strength of the film.

Examples of the polymerizable monomer include radical polymerizable compounds and cationic polymerizable compounds. Preferable is a polyfunctional radical polymerizable monomer and a compound copolymerizable with the liquid crystal compound containing a polymerizable group is preferable. Examples thereof include those described in paragraphs "0018" to "0020" of JP2002-296423A.

The amount of the polymerizable monomer added is preferably 1 to 50% by mass and more preferably 2 to 30% by mass with respect to the total mass of the liquid crystal compound.

The composition may include a surfactant from the viewpoints of evenness of the coating film and the strength of the film.

The surfactant includes conventionally known compounds and particularly a fluorine-based compound is preferable. Specific examples thereof include compounds described in paragraphs "0028" to "0056" of JP2001-330725A, and compounds described in paragraphs "0069" to "0126" of JP2003-295212.

The composition may include a solvent and an organic solvent is preferably used. Examples of the organic solvent include amides (for example, N,N-dimethylformamide), sulfoxides (for example, dimethylsulfoxide), heterocyclic compounds (for example, pyridine), hydrocarbons (for example, benzene, and hexane), alkyl halides (for example, chloroform, and dichloromethane), esters (for example, methyl acetate, ethyl acetate, and butyl acetate), ketones (for example, acetone, and methyl ethyl ketone) and ethers (for example, tetrahydrofuran, and 1,2-dimethoxyethane). Among these, alkyl halides and ketones are preferable. Two or more organic solvents may be used in combination.

The composition may include various aligning agents such as vertical alignment promoting agents such as a polarizer interface-side vertically aligning agent, and an air interface-side vertically aligning agent, and horizontal alignment promoting agents such as a polarizer interface-side horizontally aligning agent and an air interface-side horizontally aligning agent. These alignment controlling agents are alignment controlling agents capable of horizontally controlling alignment of the rod-like liquid crystal compound in a polarizer interface side or in an air interface side and vertically controlling alignment of the disk-like liquid crystal compound. As these alignment controlling agents, known compounds may be appropriately used. Examples of a polarizer interface-side vertical aligning agent for the disk-like liquid crystal compound include compounds described in paragraphs "0079" to "0104" of JP2012-215704A, and examples of an air interface-side vertical aligning agent for the disk-like liquid crystal compound include compounds described in paragraphs "0106" to "0113" of JP2012-215704A. The contents thereof are incorporated in the present specification by reference.

Further, the composition may include an adhesion improver, a plasticizer, a polymer, and the like other than the above components.

(λ/4 Plate (λ/4 Wavelength Plate))

The λ/4 plate 16 is a layer that is arranged between the first optically anisotropic layer 14A and the organic EL display panel 18 which will be described later.

The λ/4 plate 16 (a plate having a λ/4 function) is a plate having a function of converting linearly polarized light having a predetermined wavelength into circularly polarized light (or circularly polarized light into linearly polarized light). More specifically, the in-plane retardation value at a predetermined wavelength of λ nm is a plate exhibiting λ/4 (or odd multiples thereof).

The in-plane retardation value of the λ/4 plate 16 at a wavelength of 550 nm (Re(550)) may have an error of about 25 nm from an ideal value (137.5 nm). For example, the error is preferably 110 to 160 nm, more preferably 120 to 150 nm, and still more preferably 130 to 145 nm.

As shown in FIG. 2, an angle θ formed between the absorption axis of the polarizer 12 and the in-plane slow axis of the λ/4 plate 16 is within a range of 45±3°. In other words, the angle θ is within a range of 42 to 48°. From the viewpoint of further improving the effect of the present invention, the angle θ is preferably within a range of 45±2°.

The above angle refers to an angle formed between the absorption axis of the polarizer 12 and the in-plane slow axis of the λ/4 plate 16 when the polarizer 12 is viewed from the normal direction of the surface thereof (in other words, when the organic EL display device is viewed from the front direction).

The λ/4 plate 16 may exhibit forward wavelength dispersibility or reverse wavelength dispersibility in a visible light region. However, from the viewpoint of further improving the effect of the present invention, it is preferable that the λ/4 plate exhibits reverse wavelength dispersibility.

In addition, Re(450) and Re(550), which are in-plane retardation values of the λ/4 plate 16 measured at wavelengths of 450 nm and 550 nm, preferably satisfy the relationship of the following Equation (Z), more preferably satisfy the relationship of the following Equation (Z1), and still more preferably satisfy the relationship of the following Equation (Z2) from the viewpoint of further improving tinting dependent on the viewing angle.

$$0.70 \leq Re(450)/Re(550) \leq 0.88 \qquad \text{Equation (Z)}$$

$$0.72 \leq Re(450)/Re(550) \leq 0.86 \qquad \text{Equation (Z1)}$$

$$0.75 \leq Re(450)/Re(550) \leq 0.83 \qquad \text{Equation (Z2)}$$

Re(550) and Re(650), which are the in-plane retardation values of the λ/4 plate 16 measured at wavelengths of 550 nm and 650 nm, preferably satisfy the relationship of the following Equation (W), more preferably satisfy the relationship of the following Equation (W1), and still more preferably satisfy the relationship of the following Equation (W2) from the viewpoint of further improving tinting dependent on the viewing angle.

$$1.01 \leq Re(650)/Re(550) \leq 1.30 \quad \text{Equation (W)}$$

$$1.01 \leq Re(650)/Re(550) \leq 1.20 \quad \text{Equation (W1)}$$

$$1.02 \leq Re(650)/Re(550) \leq 1.15 \quad \text{Equation (W2)}$$

Rth(550), which is an in-plane retardation value of the λ/4 plate 16 in the thickness direction measured at a wavelength of 550 nm, is preferably −120 to 120 nm and more preferably −80 to 80 nm from the viewpoint of further improving the effect of the present invention.

In FIG. 1, the λ/4 plate 16 has a single layer structure but is not limited to this embodiment. The λ/4 plate may have a multilayer structure. In the case of the λ/4 plate 16 having a multilayer structure, an angle formed between the in-plane slow axis of the λ/4 plate and the absorption axis of the polarizer calculated in the case in which the entire laminate including plural layers is considered as one layer may be within a range of 45°±3°. Examples of the multilayer structure include a broadband λ/4 plate formed by laminating a λ/4 plate and a λ/2 plate. In the case of the embodiment, an angle formed between the average angle between the in-plane slow axis of the λ/4 plate and the in-plane slow axis of the λ/2 plate (the in-plane slow axis of the entire laminate), and the absorption axis of the polarizer is within a range of 45°±3°, and an angle formed between the in-plane slow axis of the λ/4 plate and the in-plane slow axis of the λ/2 plate is preferably 60°.

The material for constituting the λ/4 plate 16 is not particularly limited as long as the material exhibits the above properties. As in the description of the above first optically anisotropic layer 14A, an embodiment including a liquid crystal compound (for example, an optically anisotropic layer including a liquid crystal compound with homogeneous alignment), a polymer film, and the like may be used. Among these, from the viewpoint of easily controlling the above properties, it is preferable that the plate includes a liquid crystal compound. More specifically, the λ/4 plate 16 is preferably a layer formed by fixing a liquid crystal compound (rod-like liquid crystal compound or disk-like liquid crystal compound) having a polymerizable group through polymerization or the like and in this case, after the layer is formed, crystallinity does not need to be exhibited any more.

A method of forming the λ/4 plate 16 is not particularly limited and known methods may be adopted. For example, the above method of forming the first optically anisotropic layer 14A (a method using a composition containing a liquid crystal compound having a polymerizable group) may be used.

(Organic EL Display Panel)

The organic EL display panel 18 is a display panel configured using an organic EL element in which an organic light emitting layer (organic electroluminescent layer) is sandwiched between electrodes (between a cathode and an anode).

The configuration of the organic EL display panel is not particularly limited but any known configuration is adopted.

(Other Layers)

The organic EL display device 10 may include layers other than the polarizer 12, the first optically anisotropic layer 14A, the λ/4 plate 16, and the organic EL display panel 18 within a range not deteriorating the effect of the present invention.

For example, the organic EL display device 10 may include an alignment film having a function of defining the alignment direction of the liquid crystal compound. The alignment position of the alignment film is not particularly limited and for example, the alignment film may be provided between the polarizer 12 and the first optically anisotropic layer 14A or the first optically anisotropic layer 14A and the λ/4 plate 16.

The alignment film generally has a polymer as a main component. Polymer materials for the alignment film are described in many publications and may be obtained from many commercially available products. The polymer material to be used is preferably a polyvinyl alcohol, polyimide, or derivatives thereof. Modified or unmodified polyvinyl alcohol is particularly preferable. With regard to alignment film that can be used in the present invention, the modified polyvinyl alcohols as described in line 24 on page 43 through line 8 on page 49 in WO01/88574A1 and paragraphs "0071" to "0095" of JP3907735B may be referenced. Typically, the alignment film is subjected to a known rubbing treatment. That is, typically, the alignment film is preferably a rubbed alignment film which has been a rubbing treatment.

The thickness of the alignment film is preferably 0.01 to 10 μm, more preferably 0.01 to 1 μm, and still more preferably 0.01 to 0.5 μm.

In addition, an optically anisotropic layer in which Re(550), which is an in-plane retardation value measured at a wavelength of 550 nm, which is 0 to 10 nm and Rth(550), which is a retardation value in a thickness direction measured at a wavelength of 550 nm, is 0 to 10 nm may be arranged between the polarizer 12 and the first optically anisotropic layer 14A.

Further, a polarizer protective film may be provided on the surface of the polarizer 12 on the viewing side.

The configuration of the polarizer protective film is not particularly limited and for example, a so-called transparent support or hard coat layer may be used or a laminate of a transparent support and a hard coat layer may be used.

As the hard coat layer, a known layer may be used and for example, a layer obtained by curing the above polyfunctional monomer may be used.

In addition, as the transparent support, a known transparent support may be used and for example, as a material for forming a transparent support, a cellulose-based polymer (hereinafter, also referred to as cellulose acylate), which is represented by triacetylcellulose, and thermoplastic norbornene-based resin (such as ZEONEX, and ZEONOR, manufactured by ZEON CORPORATION, or ARTON, manufactured by JSR CORPORATION), acrylic resin, and polyester-based resin may be used.

The thickness of the polarizer protective film is not particularly limited and due to the reason for reducing the thickness of the polarizing plate or the like, the thickness is preferably 40 μm or less and more preferably 25 μm or less.

Second Embodiment

Figure 3:
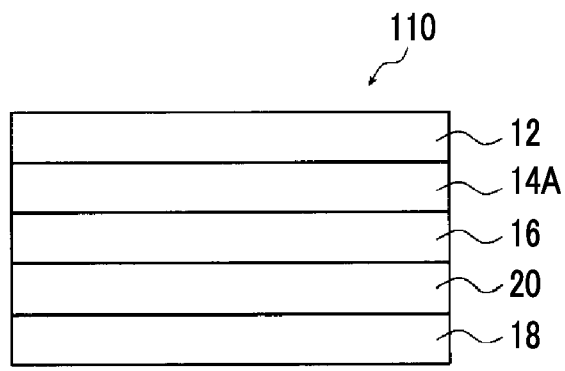
FIG. 3 is a cross-sectional view showing a second embodiment of the organic EL display device of the present invention.

Hereinafter, a second embodiment of the organic EL display device of the present invention will be described with reference to the drawing. FIG. 3 is a cross-sectional view showing a second embodiment of the organic EL display device of the present invention.

An organic EL display device 110 has a polarizer 12, a first optically anisotropic layer 14A, a λ/4 plate 16, a second optically anisotropic layer 20, and an organic EL display panel 18 in this order from the viewing side.

The organic EL display device 110 shown in FIG. 3 has the same layers as those of the organic EL display device 10 shown in FIG. 1 except that the second optically anisotropic layer 20 is provided. Thus, the same reference numerals are applied to the same constituent elements and the description thereof is omitted. The second optically anisotropic layer 20 will be mainly described in detail below.

In the organic EL display device 110, a correlation among the direction of the absorption axis of the polarizer 12, and the directions of the in-plane slow axis of the first optically anisotropic layer 14A and the in-plane slow axis of the λ/4 plate 16 satisfies the same correlation among the respective layers in the above organic EL display device 10. In addition, the organic EL display device 110 may have other layers that may be included in the above organic EL display device 10.

(Second Optically Anisotropic Layer 20)

The second optically anisotropic layer 20 is a layer to be arranged between the λ/4 plate 16 and the organic EL display panel 18. When this layer is arranged, the effect of the present invention is further improved.

Re(550), which is an in-plane retardation value of the second optically anisotropic layer 20 measured at a wavelength of 550 nm, is preferably 0 to 10 nm and more preferably 0 to 5 nm from the viewpoint of further improving the effect of the present invention.

Rth(550), which is a retardation value of the second optically anisotropic layer 20 in the thickness direction measured at a wavelength of 550 nm, is preferably −110 to −25 nm, more preferably −90 to −40 nm, and still more preferably −80 to −50 nm from the viewpoint of further improving the effect of the present invention.

The second optically anisotropic layer 20 is preferably a so-called positive C plate.

The retardation value of the second optically anisotropic layer 20 in the thickness direction may exhibit forward wavelength dispersibility or reverse wavelength dispersibility. However, from the viewpoint of further improving the effect of the present invention, it is preferable that the second optically anisotropic layer exhibits reverse wavelength dispersibility. Herein, the wavelength dispersibility is preferably exhibited in a visible light region.

In order for the retardation value of the second optically anisotropic layer 20 in the thickness direction to appropriately exhibit reverse wavelength dispersibility, specifically, the second optically anisotropic layer 20 preferably satisfies the following Equation (III) and more preferably satisfies Equations (III) and (IV).

$$0.70 \leq Rth(450\ nm)/Rth(550\ nm) \leq 0.88 \quad \text{Equation (III):}$$

$$1.01 \leq Rth(650\ nm)/Rth(550\ nm) \leq 1.30 \quad \text{Equation (IV):}$$

Rth(450) and Rth(650) above represent retardation values of the second optically anisotropic layer 20 in thickness direction, which are respectively measured at wavelengths of 450 nm and 650 nm.

The material for constituting the second optically anisotropic layer 20 is not particularly limited as long as the material exhibits the above properties. As in the description of the above first optically anisotropic layer 14A, an embodiment including a liquid crystal compound, a polymer film and the like may be used. Among these, from the viewpoint of easily controlling the above properties, it is preferable that the layer includes a liquid crystal compound. More specifically, the second optically anisotropic layer 20 is preferably a layer formed by fixing a liquid crystal compound (rod-like liquid crystal compound or disk-like liquid crystal compound) having a polymerizable group through polymerization or the like and in this case, after the layer is formed, crystallinity does not need to be exhibited any more.

A method of forming the second optically anisotropic layer 20 is not particularly limited and known methods may be adopted. For example, the above method of forming the first optically anisotropic layer 14A (a method using a composition containing a liquid crystal compound having a polymerizable group) may be used.

Third Embodiment

Figure 4:
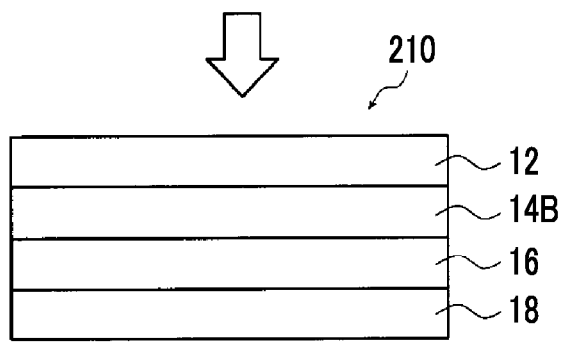
FIG. 4 is a cross-sectional view showing a third embodiment of the organic EL display device of the present invention.

Hereinafter, a third embodiment of the organic EL display device of the present invention will be described with reference to the drawings. FIG. 4 is a cross-sectional view showing a third embodiment of the organic EL display device of the present invention.

An organic EL display device 210 has a polarizer 12, a first optically anisotropic layer 14B, a λ/4 plate 16, and an organic EL display panel 18 in this order from the viewing side. In FIG. 4, the organic EL display device 210 is viewed from a direction of a void arrow. The polarizer 12, the first optically anisotropic layer 14B, and the λ/4 plate 16 configure a so-called circularly polarizing plate.

Figure 5:
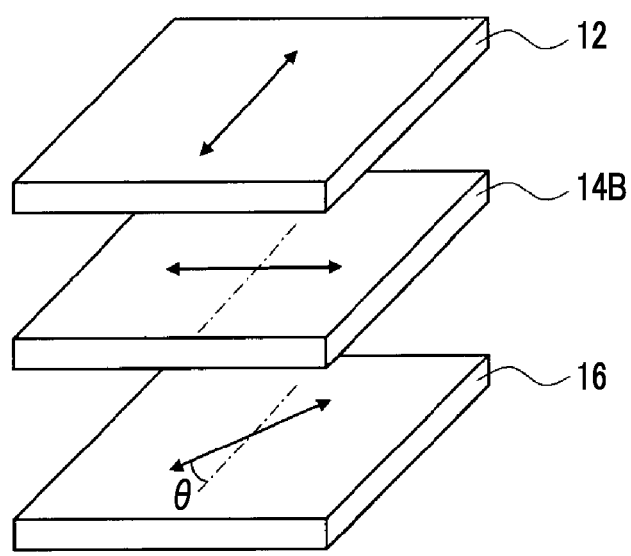
FIG. 5 is a view showing a relationship among an absorption axis of a polarizer, an in-plane slow axis of a first optically anisotropic layer, and an in-plane slow axis of a λ/4 plate in the third embodiment of the organic EL display device of the present invention.

In addition, FIG. 5 shows a relationship among the absorption axis of the polarizer 12, the in-plane slow axis of the first optically anisotropic layer 14B, and the in-plane slow axis of the λ/4 plate 16. In FIG. 5, the arrow in the polarizer 12 represents a direction of the absorption axis, the arrows in the first optically anisotropic layer 14B and the λ/4 plate 16 represent directions of the in-plane slow axes in the respective layers.

The organic EL display device 210 shown in FIG. 4 has the same layers as those of the organic EL display device 10 shown in FIG. 1 except that the first optically anisotropic layer 14B is provided. Thus, the same reference numerals are applied to the same constituent elements and the description thereof is omitted. The first optically anisotropic layer 14B will be mainly described in detail below.

As shown in FIG. 5, an angle θ formed between the absorption axis of the polarizer 12 and the in-plane slow axis of the λ/4 plate 16 is within a range of 45±3° as in the first embodiment. A preferable range thereof is as described above. In addition, the organic EL display device 210 may have other layers which are not included in the t above organic EL display device 10.

(First Optically Anisotropic Layer 14B)

The first optically anisotropic layer 14B is a layer to be arranged between the polarizer 12 and the λ/4 plate 16 similar to the first optically anisotropic layer 14A.

The first optically anisotropic layer 14B has the same definition as the that of the above first optically anisotropic layer 14A except the direction of the in-plane slow axis, the Nz factor, and Rth(550). More specifically, Re(550), which is the in-plane retardation value of the first optically anisotropic layer 14B measured at a wavelength of 550 nm, satisfies the above Equation (X) and a preferable range thereof is as described above. In addition, the average refractive index of the first optically anisotropic layer 14B and the average refractive index of the polarizer 12 satisfy the above Equation (Y) and a preferable range thereof is as described above. Further, the first optically anisotropic layer 14B may exhibit forward wavelength dispersibility or reverse wavelength dispersibility and reverse wavelength dispersibility is preferably exhibited.

Hereinafter, the direction of the in-plane slow axis, the Nz factor, and Rth(550) of the first optically anisotropic layer 14B will be described in detail.

The first optically anisotropic layer and the polarizer are arrange such that the in-plane slow axis of the first optically anisotropic layer 14B is orthogonal to the absorption axis of the polarizer 12. The definition of being orthogonal is as described above.

In addition, the Nz factor of the first optically anisotropic layer 14B is −0.1 or more and less than 0.5 and preferably −0.05 to 0.35. A method of calculating the Nz factor is as described above.

Further, Rth(550), which is a retardation value of the first optically anisotropic layer 14B in the thickness direction measured at a wavelength of 550 nm, is preferably −270 to 0 nm and more preferably −220 to −0.1 nm from the viewpoint of further improving the effect of the present invention.

The first optically anisotropic layer 14B is preferably a so-called A plate (particularly, a negative A plate).

The material for constituting the first optically anisotropic layer 14B is not particularly limited as long as the material exhibits the above properties. As in the description of the above first optically anisotropic layer 14A, an embodiment including a liquid crystal compound (for example, an optically anisotropic layer including a liquid crystal compound with homogeneous alignment), a polymer film and the like may be used. Among these, from the viewpoint of easily controlling the above properties, it is preferable that the layer includes a liquid crystal compound. It is more preferable that the layer includes a disk-like liquid crystal compound. More specifically, the first optically anisotropic layer 14B is preferably a layer formed by fixing a liquid crystal compound (rod-like liquid crystal compound or a disk-like liquid crystal compound) having a polymerizable group through polymerization or the like and in this case, after the layer is formed, crystallinity does not need to be exhibited any more.

A method of forming the first optically anisotropic layer 14B is not particularly limited and known methods may be adopted. For example, the above method of forming the first optically anisotropic layer 14A (a method using a composition containing a liquid crystal compound having a polymerizable group) may be used.

Among these, from the viewpoints of easily controlling the above Nz factor or the like and further improving the effect of the present invention, the liquid crystal compound to be included in the first optically anisotropic layer 14B is preferably a disk-like liquid crystal compound.

Fourth Embodiment

Figure 6:
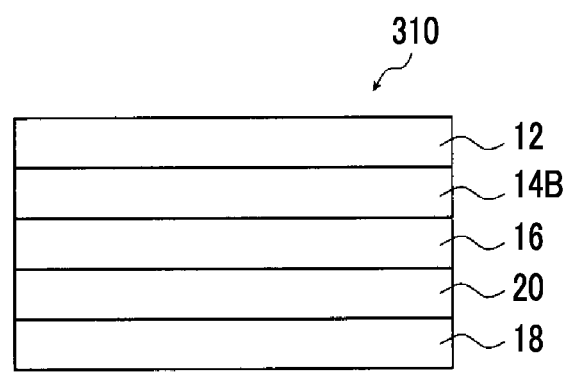
FIG. 6 is a cross-sectional view showing a fourth embodiment of the organic EL display device of the present invention.

Hereinafter, a fourth embodiment of the organic EL display device of the present invention will be described with reference to the drawing. FIG. 6 is a cross-sectional view showing a fourth embodiment of the organic EL display device of the present invention.

An organic EL display device 310 has a polarizer 12, a first optically anisotropic layer 14B, a λ/4 plate 16, a second optically anisotropic layer 20, and organic EL display panel 18 in this order from the viewing side.

The organic EL display device 310 shown in FIG. 6 has the same layers as those of the organic EL display device 210 shown in FIG. 4 except that the second optically anisotropic layer 20 is provided. In addition, the second optically anisotropic layer 20 is a layer included in the above second embodiment. Accordingly, the same reference numerals are assigned to the respective layers and the description thereof is omitted.

When the second optically anisotropic layer 20 is provided, the effect of the present invention is further improved.

In the organic EL display device 310, a correlation among the direction of the absorption axis of the polarizer 12, and the directions of the in-plane slow axis of the first optically anisotropic layer 14B and the in-plane slow axis of the λ/4 plate 16 satisfies the same correlation among the respective axes in the above organic EL display device 210. In addition, the organic EL display device 310 may have other layers that may be included in the above organic EL display device 10.

EXAMPLES

Hereinafter, the present invention will be more specifically described based on examples. The materials, the amount of the materials used, the ratio between the materials, the content and the procedures of treatment, and the like shown in the following examples can be appropriately modified as long as the modification does not depart from the gist of the present invention. Accordingly, the scope of the present invention is not limited to the following specific examples.

Example 1

<Preparation of Circularly Polarizing Plate 1>
<Preparation of Protective Film>

The following composition was put into a mixing tank and stirred to dissolve each component. Thus, a core layer cellulose acylate dope 1 was prepared.

| | |
|---|---|
| Cellulose acetate with an acetyl substitution degree of 2.88 | 100 parts by mass |
| Ester oligomer (Compound 1-1) | 10 parts by mass |
| Durability enhancer (Compound 1-2) | 4 parts by mass |
| Ultraviolet absorbent (Compound 1-3) | 3 parts by mass |
| Methylene chloride (First solvent) | 438 parts by mass |
| Methanol (Second solvent) | 65 parts by mass |

(Compound 1-1)

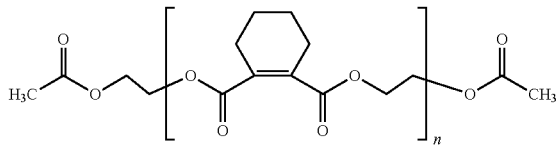

Molecular weight 1,000
(Compound 1-2)

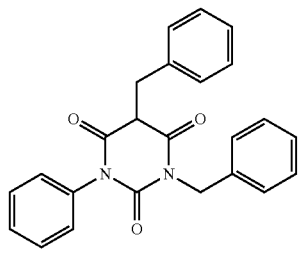 [SMILES: O=C1C(Cc2ccccc2)C(=O)N(c2ccccc2)C(=O)N1Cc1ccccc1]

(Compound 1-3)

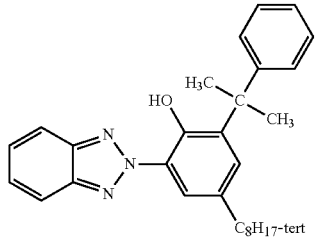

[Preparation of Outer Layer Cellulose Acylate Dope 1]

To 90 parts by mass of the above core layer cellulose acylate dope 1, 10 parts by mass of a matting agent dispersion 1 having the following composition was added to prepare an outer layer cellulose acylate dope 1.

| | |
|---|---|
| Silica particles with an average particle size of 20 nm (AEROSIL R972, manufactured by NIPPON AEROSIL CO., LTD.) | 2 parts by mass |
| Methylene chloride (First solvent) | 76 parts by mass |
| Methanol (Second solvent) | 11 parts by mass |
| Core layer cellulose acylate dope 1 | 1 part by mass |

[Preparation of Cellulose Acylate Film]

Three layers consisting of core layer cellulose acylate dope 1 and to each side thereof outer layer cellulose acylate dope 1 were simultaneously cast onto a drum at 20° C. from casting ports. In a state of a solvent content of about 20% by mass, the layers were peeled off, two edges of the film in a width direction were fixed with tenter clips, and the remaining solvent in a state of 3 to 15% by mass was dried while conducting 1.2-fold stretching in a horizontal direction. Then, by means of conveyance between the rolls of a heat treatment device, a cellulose acylate film having a thickness of 25 μm was prepared as a polarizing plate protective film 01.

<Preparation of Hard Coat Layer>

As a hard coat layer forming coating liquid, a curable composition 1 for hard coat shown in Table 1 below was prepared.

TABLE 1

| | Monomer | | | | UV initiator | | |
|---|---|---|---|---|---|---|---|
| | Monomer 1 | Monomer 2 | Monomer 1/Monomer 2 | Total amount of addition [parts by mass] | Type | Amount of addition [parts by mass] | Solvent |
| Hard coat 1 | Pentaerythritol triacrylate | Pentaerythritol tetraacrylate | 3/2 | 53.5 | UV initiator 1 | 1.5 | Ethyl acetate |

(Compound 2-1)

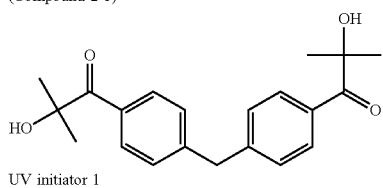

UV initiator 1

The above curable composition 1 for hard coat was applied to the surface of the above-prepared polarizing plate protective film 01, then dried at 100° C. for 60 seconds, and was irradiated with ultraviolet rays (UV) under the condition of 0.1% nitrogen or less at 1.5 kW in a dose of 300 mJ. Then, the composition was cured to prepare a protective film 01 with a hard coat layer having a hard coat layer having a thickness of 3 μm. The thickness of the hard coat layer was adjusted by adjusting the coating amount according to a die coating method using a slot die.

<Preparation of Polarizing Plate 01 with Protective Film on One Side>

1) Saponification of Film

The above-prepared protective film 01 with a hard coat layer was immersed in a 4.5 mol/L aqueous sodium hydroxide solution (saponification solution) that had been adjusted to 37° C. for 1 minute. Then, the film was rinsed with water, then immersed in a 0.05 mol/L aqueous sulfuric acid solution for 30 seconds, and rinsed with water again. Water was removed using an air knife three times. After removing the water, the film was placed in a drying zone at 70° C. for 15 seconds and dried to prepare a saponified protective film 01 with a hard coat layer.

2) Preparation of Polarizer

The drying conditions were changed according to Example 1 described in JP2001-141926A and a difference in the circumferential speed between 2 pairs of nip rollers was given. The film was stretched in the longitudinal direction to prepare a polarizer having a width of 1,330 mm and a thickness of 15 μm. The polarizer prepared as described above was used as a polarizer 1.

3) Lamination

The polarizer 1 obtained as described above was laminated with the saponified protective film 01 with a hard coat layer using a 3% by mass aqueous solution of polyvinyl alcohol (PVA) (PVA-117H, manufactured by Kuraray Co., Ltd.) as an adhesive by roll-to-roll such that the absorption axis of the polarizer 1 is parallel with the longitudinal direction of the film (the protective film 01 with a hard coat layer) to prepare a polarizing plate 01 with a protective film on one side (hereinafter, simply referred to as a polarizing plate 01).

At this time, the protective film was laminated such that the cellulose acylate film side of the protective film becomes a polarizer side.

<Preparation of Polarizing Plate 02 with Protective Film on One Side>

A polarizing plate 02 with a protective film on one side (hereinafter, simply referred to as a polarizing plate 02) was prepared in the same manner as in the preparation of the polarizing plate 01 with a protective film on one side except that the thickness of a raw material used for preparing a polarizer in the preparation of the polarizing plate 01 was changed to prepare a polarizer having a thickness of 8 μm and further the drying conditions were changed.

<Formation of First Optically Anisotropic Layer>

The surface of the polarizing plate 01 on the side close to the polarizer was subjected to a rubbing treatment in a direction parallel with the absorption axis of the polarizer. The following coating liquid A-1 for an optically anisotropic layer was applied to the rubbed surface. Next, the film was subjected to thermal aging at a film surface temperature of 60° C. for 60 seconds and then irradiated with ultraviolet rays with a dose of 500 mJ/cm² using an air cooling metal halide lamp (manufactured by EYEGRAPHICS CO., LTD.) at a film surface temperature of 60° C. in the air to fix the alignment state thereof. Thus, the first optically anisotropic layer was formed. In the formed first optically anisotropic layer, a rod-like liquid crystal compound was horizontally aligned and the in-plane slow axis direction was parallel with the rubbing direction, that is, the in-plane slow axis direction was parallel with the absorption axis direction of the polarizer. The first optically anisotropic layer was formed on a separately prepared glass plate and when the light incident angle dependency of Re and Rth was measured using an automatic birefringence system (KOBRA-21ADH, manufactured by OJI SCIENCE INSTRUMENTS), Re(550) was 250 nm, Rth(550) was 125 nm, and Re(450)/Re(550) was 0.77 at a wavelength of 550 nm.

Composition of Coating Liquid A-1 for Optically Anisotropic Layer

| | |
|---|---|
| Rod-like liquid crystal compound 1 | 80 parts by mass |
| Rod-like liquid crystal compound 2 | 20 parts by mass |
| Photopolymerization initiator 1 (IRGACURE 819, manufactured by BASF) | 3.0 parts by mass |
| Fluorine-containing compound 1 | 1.0 part by mass |
| Adhesion improver 1 | 0.5 parts by mass |
| Crosslinking polymer 1 | 1.2 parts by mass |
| Methyl ethyl ketone | 247 parts by mass |

Rod-like liquid crystal compound 1

Rod-like liquid crystal compound 2

Photopolymerization initiator 1

TABLE 2

| | Flourine-containing compound 1 | Flourine-containing compound 2 |
|---|---|---|
| (CF$_2$)$_6$F acrylate | | 32.5 |
| 4-CN phenyl carbonate acrylate | | 17.5 |
| poly(propylene glycol) acrylate | | 50 |
| (CF$_2$)$_6$H acrylate | | 90 |
| acrylic acid (OH) | | 10 |
| Weight average molecular weight (Mw) | 19,000 | 16,000 |

The numeral values in the column of "Fluorine-containing compound 1" and the column of "Fluorine-containing compound 2" in Table 2 above represent a content mol % of each repeating unit.

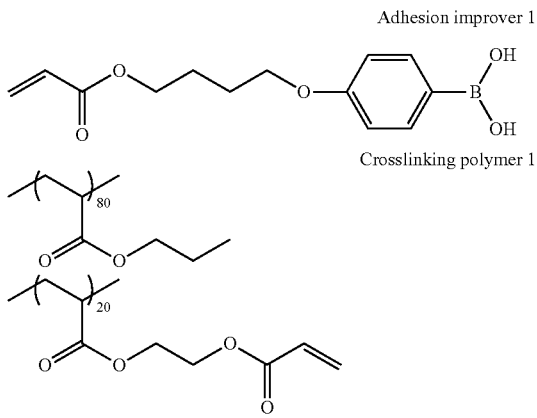

Adhesion improver 1

Crosslinking polymer 1

<Formation of λ/4 Plate>

The first optically anisotropic layer formed on the polarizing plate 01 was subjected to a rubbing treatment in a 45° direction with respect to the absorption axis of the polarizer. The coating liquid B-1 for an optically anisotropic layer was applied to the rubbed surface. Next, the film was subjected to thermal ageing at a film surface temperature of 60° C. for 60 seconds and then irradiated with ultraviolet rays with a dose of 500 mJ/cm² using an air cooling metal halide lamp (manufactured by EYEGRAPHICS CO., LTD.) at a film surface temperature of 60° C. in the air to fix the alignment state thereof. Thus, a λ/4 plate was formed. In the formed λ/4 plate, a rod-like liquid crystal compound was horizontally aligned and the in-plane slow axis direction was parallel with the rubbing direction, that is, the in-plane slow axis direction was tilted at 45° with respect to the absorption axis direction of the polarizer. The λ/4 plate was formed on a separately prepared glass plate and when the light incident angle dependency of Re and Rth was measured using an automatic birefringence system (KOBRA-21ADH, manufactured by OJI SCIENCE INSTRUMENTS), Re(550) was 138 nm, Rth(550) was 69 nm, Re(450)/Re(550) was 0.77, and Re(650)/Re(550) was 1.05 at a wavelength of 550 nm.

Composition of Coating Liquid B-1 for Optically Anisotropic Layer

| | |
|---|---|
| Rod-like liquid crystal compound 1 | 80 parts by mass |
| Rod-like liquid crystal compound 2 | 20 parts by mass |
| Photopolymerization initiator 1 (IRGACURE 819, manufactured by BASF) | 3.0 parts by mass |
| Fluorine-containing compound 1 | 1.0 parts by mass |
| Crosslinking polymer 1 | 1.2 parts by mass |
| Methyl ethyl ketone | 247 parts by mass |

<Formation of Second Optically Anisotropic Layer>

The following coating liquid C-1 for an optically anisotropic layer was applied to the λ/4 plate formed on the polarizing plate 01 and aged at 60° C. for 60 seconds. Then, the film was irradiated with ultraviolet rays with a dose of 1,000 mJ/cm² using an air cooling metal halide lamp (manufactured by EYEGRAPHICS CO., LTD.) with an intensity of 70 mW/cm² in the air to fix the alignment state thereof. Thus, a second optically anisotropic layer was formed. In the formed second optically anisotropic layer, a rod-like liquid crystal compound was vertically aligned. The second optically anisotropic layer was formed on a separately prepared glass plate and when the light incident angle dependency of Re and Rth was measured using an automatic birefringence system (KOBRA-21ADH, manufactured by OJI SCIENCE INSTRUMENTS), Re(550) was 0.1 nm, Rth(550) was −65 nm, and Rth(450)/Rth(550) was 0.77 at a wavelength of 550 nm.

Composition of Coating Liquid C-1 for Optically Anisotropic Layer

| | |
|---|---|
| Rod-like liquid crystal compound 1 | 80 parts by mass |
| Rod-like liquid crystal compound 2 | 20 parts by mass |
| Vertical aligning agent 1 | 1.0 part by mass |
| Vertical aligning agent 2 | 0.5 parts by mass |
| Ethylene oxide-modified trimethylol propane triacrylate (V#360, manufactured by OSAKA ORGANIC CHEMICAL INDUSTRY LTD.) | 8 parts by mass |
| Photopolymerization initiator 1 (IRGACURE 819, manufactured by BASF) | 3.0 parts by mass |
| Fluorine-containing compound 2 | 0.4 parts by mass |
| Methyl ethyl ketone | 263 parts by mass |

Vertical aligning agent 1

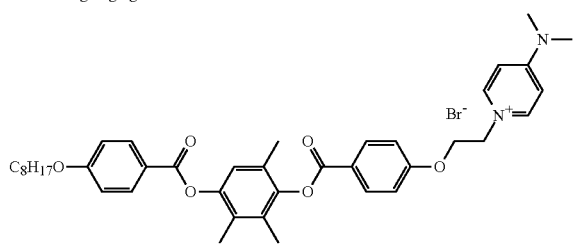

Vertical aligning agent 2

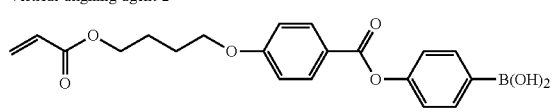

Example 2

<Preparation of Circularly Polarizing Plate 2>

A circularly polarizing plate 2 was prepared in the same manner as in Example 1 except that the coating liquid A-1 for an optically anisotropic layer in the formation of the first optically anisotropic layer was changed to the following coating liquid A-2 for an optically anisotropic layer. The first optically anisotropic layer was formed on a separately prepared glass plate and when the light incident angle dependency of Re and Rth was measured using an automatic birefringence system (KOBRA-21ADH, manufactured by OJI SCIENCE INSTRUMENTS), Re(550) was 250 nm, Rth(550) was 125 nm, and Re(450)/Re(550) was 1.09 at a wavelength of 550 nm.

Composition of Coating Liquid A-2 for Optically Anisotropic Layer

| | |
|---|---|
| Rod-like liquid crystal compound 2 | 80 parts by mass |
| Rod-like liquid crystal compound 3 | 20 parts by mass |
| Photopolymerization initiator 1 (IRGACURE 819, manufactured by BASF) | 3.0 parts by mass |
| Fluorine-containing compound 1 | 1.0 parts by mass |
| Adhesion improver 1 | 0.5 parts by mass |
| Crosslinking polymer 1 | 1.2 parts by mass |
| Methyl ethyl ketone | 247 parts by mass |

Rod-like liquid crystal compound 3

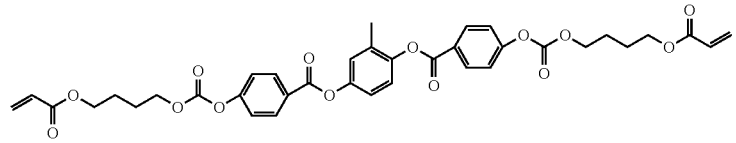 [SMILES: C=CC(=O)OCCCCOC(=O)Oc1ccc(C(=O)Oc2ccc(OC(=O)c3ccc(OC(=O)OCCCCOC(=O)C=C)cc3)c(C)c2)cc1]

Example 3

<Preparation of Circularly Polarizing Plate 3>

A circularly polarizing plate 3 was prepared in the same manner as in Example 2 except that the coating liquid C-1 for an optically anisotropic layer in the formation of the second optically anisotropic layer was changed to the following coating liquid C-3 for an optically anisotropic layer. The second optically anisotropic layer was formed on a separately prepared glass plate and when the light incident angle dependency of Re and Rth was measured using an automatic birefringence system (KOBRA-21ADH, manufactured by OJI SCIENCE INSTRUMENTS), Re(550) was 0.1 nm, Rth(550) was −65 nm, and Rth(450)/Rth(550) was 1.09 at a wavelength of 550 nm.

Composition of Coating Liquid C-3 for Optically Anisotropic Layer

| | |
|---|---|
| Rod-like liquid crystal compound 2 | 80 parts by mass |
| Rod-like liquid crystal compound 3 | 20 parts by mass |
| Vertical aligning agent 1 | 1.0 part by mass |
| Vertical aligning agent 2 | 0.5 parts by mass |
| Ethylene oxide-modified trimethylol propane triacrylate (V#360, manufactured by OSAKA ORGANIC CHEMICAL INDUSTRY LTD.) | 8 parts by mass |
| Photopolymerization initiator 1 (IRGACURE 819, manufactured by BASF) | 3.0 parts by mass |
| Fluorine-containing compound 2 | 0.4 parts by mass |
| Methyl ethyl ketone | 263 parts by mass |

Example 4

<Preparation of Circularly Polarizing Plate 4>

A circularly polarizing plate 4 was prepared in the same manner as in Example 3 except that in the formation of the second optically anisotropic layer, the thickness of the coating film was changed.

Example 5

<Preparation of Circularly Polarizing Plate 5>

A circularly polarizing plate 5 was prepared in the same manner as in Example 3 except that in the formation of the second optically anisotropic layer, the thickness of the coating film was changed.

Example 6

(Preparation of Peelable Support A-6 on which First Optically Anisotropic Layer was Formed)

(Formation of Alignment Film)

An alignment film coating liquid O-6 having the following composition was continuously applied to a commercially available cellulose acylate film "FUJI-TAC TD60UL" (manufactured by FUJIFILM CORPORATION) which had not been saponified with alkali using a #14 wire bar. The film was dried with hot air at 60° C. for 60 seconds and further dried with hot air at 100° C. for 120 seconds. Thus, an alignment film O-6 was formed on a peelable support.

Composition of Alignment Film Coating Liquid O-6

| | |
|---|---|
| Modified polyvinyl alcohol 1 shown below | 10 parts by mass |
| Water | 371 parts by mass |
| Methanol | 119 parts by mass |
| Glutaraldehyde (Crosslinking agent) | 0.5 parts by mass |
| Citric acid ester (AS3, manufactured by SANKYO CHEMICAL Co., Ltd.) | 0.175 parts by mass |
| Photopolymerization initiator (IRGACURE 2959, Ciba Specialty Chemicals) | 2.0 parts by mass |

[Modified Polyvinyl Alcohol 1]

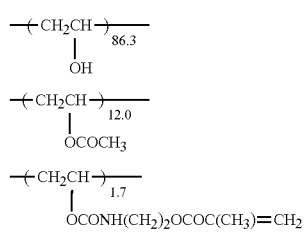

(Formation of First Optically Anisotropic Layer A-6)

The above-prepared alignment film was subjected to a continuous rubbing treatment. At this time, the rubbing treatment was carried out such that the film was rubbed in a direction parallel with the longitudinal direction of the long film.

The coating liquid A-2 for an optically anisotropic layer including a rod-like liquid crystal compound was continuously applied to the above-prepared alignment film using a #2.2 wire bar. The conveyance speed (V) of the film was set to 26 m/min. For the drying of the solvent of the coating liquid and the alignment aging of the rod-like liquid crystal compound, the coating film was heated with hot air at 60° C. for 60 seconds and irradiated with UV at 60° C. to fix the alignment of the liquid crystal compound. Thus, a peelable support A-6 on which a first optically anisotropic layer A-6 was formed was prepared. The first optically anisotropic layer A-6 was formed on a separately prepared glass plate and when the light incident angle dependency of Re and Rth was measured using an automatic birefringence system (KOBRA-21ADH, manufactured by OJI SCIENCE INSTRUMENTS), Re(550) was 250 nm, Rth(550) was 125 nm, and Re(450)/Re(550) was 1.09 at a wavelength of 550 nm.

(Preparation of Peelable Support B-6 on which λ/4 Plate was Formed)

A peelable support having an alignment film O-6 was prepared in the same procedure as in the preparation of the peelable support A-6 on which the first optically anisotropic layer was formed. Next, a rubbing treatment was carried out on the alignment film O-6 in a 450 direction with respect to the longitudinal direction of the long film and the following coating liquid B-6 for an optically anisotropic layer was applied to the rubbed surface. Next, the coating film was thermally aged at a film surface temperature of 60° C. for 60 seconds and then irradiated with ultraviolet rays with a dose of 500 mJ/cm$^2$ using an air cooling metal halide lamp (manufactured by EYEGRAPHICS CO., LTD.) at a film surface temperature of 60° C. in the air to fix the alignment state thereof. Thus, a λ/4 plate B-6 was formed. In the formed λ/4 plate B-6, a rod-like liquid crystal compound was horizontally aligned and the in-plane slow axis direction was parallel with the rubbing direction, that is, the in-plane slow axis direction was tilted at 45° with respect to the longitudinal direction of the long film. The λ/4 plate B-6 was formed on a separately prepared glass plate and when the light incident angle dependency of Re and Rth was measured using an automatic birefringence system (KOBRA-21ADH, manufactured by OJI SCIENCE INSTRUMENTS), Re(550) was 138 nm, Rth(550) was 69 nm, Re(450)/Re(550) was 0.84, and Re(650)/Re(550) was 1.04 at a wavelength of 550 nm.

Composition of Coating Liquid B-6 for Optically Anisotropic Layer

| | |
|---|---|
| Rod-like liquid crystal compound 1 | 75 parts by mass |
| Rod-like liquid crystal compound 2 | 25 parts by mass |
| Photopolymerization initiator 1 (IRGACURE 819, manufactured by BASF) | 3.0 parts by mass |
| Fluorine-containing, compound 1 | 1.0 part by mass |
| Crosslinking polymer 1 | 1.2 parts by mass |
| Methyl ethyl ketone | 247 parts by mass |

(Preparation of Peelable Support C-6 on which Second Optically Anisotropic Layer was Formed)

A peelable support having an alignment film O-6 was prepared in the same procedure as in the preparation of the peelable support A-6 on which the first optically anisotropic layer was formed. Next, the coating liquid C-3 for an optically anisotropic layer was applied to the alignment film O-6 and the coating film was thermally aged at 60° C. for 60 seconds and then irradiated with ultraviolet rays with a dose of 1,000 mJ/cm$^2$ using an air cooling metal halide lamp (manufactured by EYEGRAPHICS CO., LTD.) with an intensity of 70 mW/cm$^2$ in the air to fix the alignment state thereof. Thus, a second optically anisotropic layer C-6 was formed. In the formed second optically anisotropic layer C-6, a rod-like liquid crystal compound was vertically aligned. The second optically anisotropic layer C-6 was formed on a separately prepared glass plate and when the light incident angle dependency of Re and Rth was measured using an automatic birefringence system (KOBRA-21ADH, manufactured by OJI SCIENCE INSTRUMENTS), Re(550) was 0.1 nm, Rth(550) was −65 nm, and Rth(450)/Rth(550) was 1.09 at a wavelength of 550 nm.

<Preparation of Circularly Polarizing Plate 6>

The surface of the polarizing plate 01 on the side close to the polarizer was continuously laminated with the surface of the peelable support A-6 on the side close to the first optically anisotropic layer A-6 using an adhesive and simultaneously the peelable support was peeled off between the cellulose acylate film and the alignment film. Subsequently, the surface of the polarizing plate 01 on the side close to the first optically anisotropic layer A-6 was continuously laminated with the surface of the peelable support B-6 on the side close to the λ/4 plate B-6 using an adhesive and simultaneously the peelable support was peeled off between the cellulose acylate film and the alignment film. Further, the surface of the polarizing plate 01 on the side close to the λ/4 plate B-6 was continuously laminated with the surface of the peelable support C-6 on the side close to the second optically anisotropic layer C-6 using an adhesive and simultaneously the peelable support was peeled off between the cellulose acylate film and the alignment film. In this manner, a long circularly polarizing plate 6 was prepared.

Example 7

<Preparation of Circularly Polarizing Plate 7>

A circularly polarizing plate 7 was prepared in the same manner as in Example 3 except that the coating liquid B-1 for an optically anisotropic layer in the formation of the λ/4 plate, was changed to the following coating liquid B-7 for an optically anisotropic layer. The λ/4 plate was formed on a separately prepared glass plate and when the light incident angle dependency of Re and Rth was measured using an automatic birefringence system (KOBRA-21ADH, manufactured by OJI SCIENCE INSTRUMENTS), Re(550) was 138 nm, Rth(550) was 69 nm, Re(450)/Re(550) was 0.88, and Re(650)/Re(550) was 1.03 at a wavelength of 550 nm.

Composition of Coating Liquid B-7 for Optically Anisotropic Layer

| | |
|---|---|
| Rod-like liquid crystal compound 1 | 70 parts by mass |
| Rod-like liquid crystal compound 2 | 30 parts by mass |
| Photopolymerization initiator 1 (IRGACURE 819, manufactured by BASE) | 3.0 parts by mass |
| Fluorine-containing compound 1 | 1.0 part by mass |
| Crosslinking polymer 1 | 1.2 parts by mass |
| Methyl ethyl ketone | 247 parts by mass |

Example 8

<Preparation of Circularly Polarizing Plate 8>

A circularly polarizing plate 8 was prepared in the same manner as in Example 3 except that in the formation of the first optically anisotropic layer, the thickness of the coating film was changed.

Example 9

<Preparation of Circularly Polarizing Plate 9>

A circularly polarizing plate 9 was prepared in the same manner as in Example 3 except that in the formation of the first optically anisotropic layer, the thickness of the coating film was changed.

Example 10

<Preparation of Circularly Polarizing Plate 10>

A circularly polarizing plate 10 was prepared in the same manner as in Example 3 except that the polarizing plate 01 was changed to the polarizing plate 02.

Example 11

<Preparation of Circularly Polarizing Plate 11>

A circularly polarizing plate 11 was prepared in the same manner as in Example 3 except that in the formation of the first optically anisotropic layer, the surface of the polarizing plate 01 on the side close to the polarizer was subjected to a rubbing treatment in a direction orthogonal to the absorption axis of the polarizer and further the coating liquid A-2 for an optically anisotropic layer was changed to the following coating liquid A-11 for an optically anisotropic layer.

The coating liquid A-11 including the disk-like (discotic) liquid crystal compound having the following composition was continuously applied to the rubbed polarizer to a rubbing treatment with a wire. The conveyance speed (V) of the film was set to 36 m/min. For the drying of the solvent of the coating film and the alignment aging of the disk-like liquid crystal compound, the coating film was heated with hot air at 120° C. for 90 seconds and irradiated with UV at 80° C. to fix the alignment of the disk-like liquid crystal compound. Thus, a first optically anisotropic layer was formed. The in-plane slow axis direction of the formed first optically anisotropic layer was parallel with the rubbing direction, that is, the in-plane slow axis direction was orthogonal to the absorption axis direction of the polarizer. The first optically anisotropic layer was formed on a separately prepared glass substrate and when the light incident angle dependency of Re and Rth was measured using an automatic birefringence system (KOBRA-21ADH, manufactured by OJI SCIENCE INSTRUMENTS), Re(550) was 250 nm, Rth(550) was −125 nm, and Re(450)/Re(550) was 1.19 at a wavelength of 550 nm.

Composition of Coating Liquid A-11 for Optically Anisotropic Layer

| | |
|---|---|
| Discotic liquid-crystal compound shown below | 91 parts by mass |
| Acrylate monomer shown below | 5 parts by mass |
| Photopolymerization initiator 1 (IRGACURE 819, manufactured by BASF) | 3.0 parts by mass |
| Pyridinium salt shown below | 0.5 parts by mass |
| Fluorine-based polymer (FP1) shown below | 0.2 parts by mass |
| Fluorine-based polymer (FP3) shown below | 0.1 part by mass |
| Methyl ethyl ketone | 189 parts by mass |

Discotic liquid-crystal compound

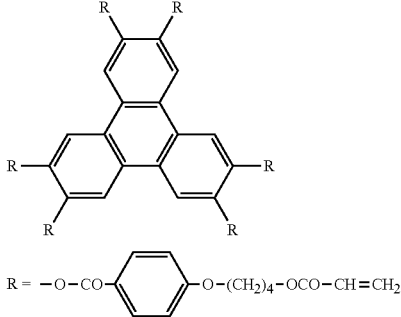

$R = -O-CO-\phantom{X}-O-(CH_2)_4-OCO-CH=CH_2$

Acrylate monomer:

Ethylene oxide-modified trimethylol propane triaerylate (V#360, manufactured by OSAKA ORGANIC CHEMICAL INDUSTRY LTD.)

Pyridinium salt

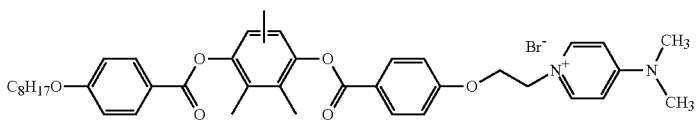

Fluorine-based polymer (FP1)

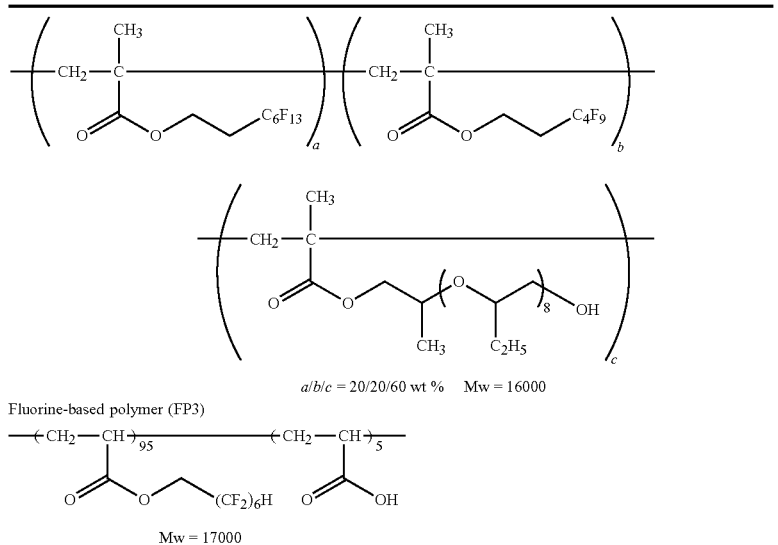

a/b/c = 20/20/60 wt %   Mw = 16000

Fluorine-based polymer (FP3)

Mw = 17000

Example 12

<Preparation of Circularly Polarizing Plate 12>

A circularly polarizing plate 12 was prepared in the same manner as in Example 11 except that in the formation of the λ/4 plate, the coating liquid B-1 for an optically anisotropic layer was changed to the coating liquid B-7 for an optically anisotropic layer.

Example 13

<Preparation of Circularly Polarizing Plate 13>

A circularly polarizing plate 13 was prepared in the same manner as in Example 3 except that in the formation of the λ/4 plate, the thickness of the coating film was changed.

Example 14

<Preparation of Circularly Polarizing Plate 14>

A circularly polarizing plate 14 was prepared in the same manner as in Example 3 except that in the formation of the λ/4 plate, the thickness of the coating film was changed.

Example 15

<Preparation of Circularly Polarizing Plate 15>

A circularly polarizing plate 15 was prepared in the same manner as in Example 11 except that in the formation of the λ/4 plate, the thickness of the coating film was changed.

Example 16

<Preparation of Circularly Polarizing Plate 16>

A circularly polarizing plate 16 was prepared in the same manner as in Example 11 except that in the formation of the λ/4 plate, the thickness of the coating film was changed.

Example 17

<Preparation of Circularly Polarizing Plate 17>

A circularly polarizing plate 17 was prepared in the same manner as in Example 3 except that the second optically anisotropic layer was not formed.

Example 18

<Preparation of Peelable Support A-18 on which Optically Anisotropic Layer A was Formed>

(Formation of Optically Anisotropic Layer A)

An alignment film O-6 was formed on a peelable support in the same manner as in the preparation of the circularly polarizing plate 6. The prepared alignment film was subjected to a continuous rubbing treatment. At this time, the longitudinal direction of the long film was parallel with the conveyance direction and an angle formed between the longitudinal direction of the film and the rotation axis of the rubbing rollers was set to 75° (clockwise) (when the longitudinal direction of the film was set at 90°, the rotation axis of the rubbing rollers was set in a direction of 15°).

A coating liquid A-18 for an optically anisotropic layer including the disk-like (discotic) liquid crystal compound having the following composition was continuously applied to the above-prepared alignment film with a wire bar. The conveyance speed of the film was set to 26 m/min. For the drying of the solvent of the coating film and the alignment aging of the discotic liquid crystal compound, the coating film was heated with hot air at 130° C. for 90 seconds, subsequently heated with hot air at 100° C. for 60 seconds, and irradiated with UV at 80° C. to fix the alignment of the liquid crystal compound. Thus, an optically anisotropic layer A was formed. It was confirmed that in the optically anisotropic layer A, the average tilt angle of the disk surface of the disk-like liquid crystal compound with respect to the film surface is 90° and the disk-like liquid crystal compound is vertically aligned with respect to the film surface. In addition, the angle of the in-plane slow axis of the optically anisotropic layer A was parallel with the rotation axis of the rubbing rollers and was set to 15° when the longitudinal direction of the film was set at 900 (the width direction of the film was set at 00).

Composition of Coating Liquid A-18 for Optically Anisotropic Layer

| | |
|---|---|
| Discotic liquid crystal compound 2 | 80 parts by mass |
| Discotic liquid crystal compound 3 | 20 parts by mass |
| Alignment film interface aligning agent 1 | 0.55 parts by mass |
| Alignment film interface aligning agent 2 | 0.05 parts by mass |
| Fluorine-containing compound 3 | 0.1 part by mass |
| Modified trimethylol-propane triacrylate | 10 parts by mass |
| Photopolymerization initiator (IRGACURE 907, manufactured by BASF) | 3 parts by mass |
| Methyl ethyl ketone | 200 parts by mass |

Discotic liquid crystal compound 2

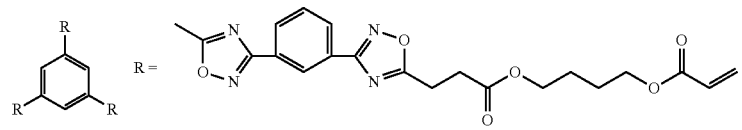

Discotic liquid crystal compound 3

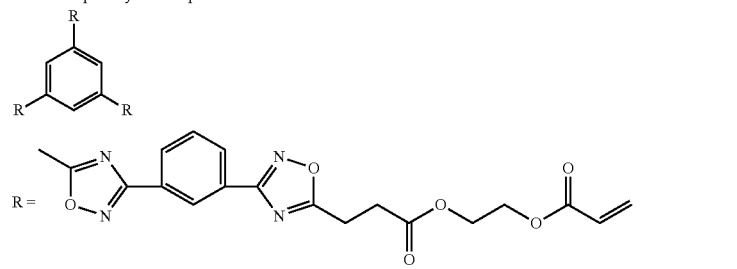

Alignment film interface aligning agent 1

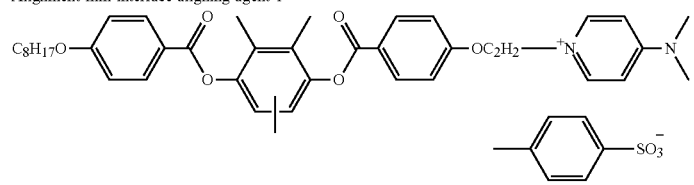

Alignment film interface aligning agent 2

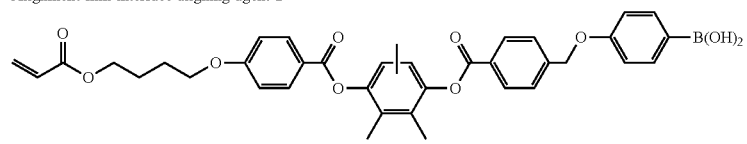

Fluorine-containing compound 3

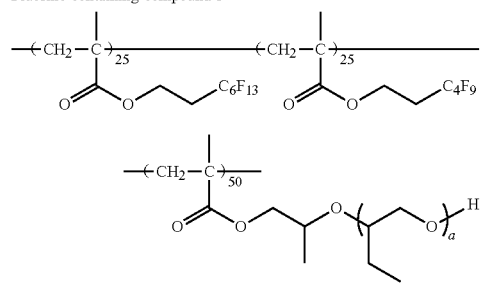

<Preparation of Peelable Support B-18 on which Optically Anisotropic Layer B was Formed>

(Formation of Optically Anisotropic Layer B)

An alignment film O-6 was formed on the peelable support in the same manner as in the preparation of the circularly polarizing plate 6. The prepared alignment film was subjected to a continuous rubbing treatment. At this time, the longitudinal direction of the long film was parallel with the conveyance direction and the angle between the longitudinal direction of the film and the rotation axis of the rubbing rollers was set to 105° (clockwise) (when the longitudinal direction of the film was set at 90°, the rotation axis of the rubbing rollers was set in a direction of −15°).

A coating liquid B-18 for an optically anisotropic layer including the rod-like liquid crystal compound having the following composition was continuously applied to the above-prepared alignment film with a wire bar. The conveyance speed of the film was set to 26 m/min. For the drying of the solvent of the coating liquid and the alignment aging of the rod-like liquid crystal compound, the coating film was heated with hot air at 60° C. for 60 seconds and irradiated with UV at 60° C. to fix the alignment of the liquid crystal compound. Thus, an optically anisotropic layer B was formed. It was confirmed that in the optically anisotropic layer B, the average tilt angle of the major axis of the rod-like liquid crystal compound with respect to the film surface is 0° and the liquid crystal compound is horizontally aligned with respect to the film surface. In addition, the angle of the in-plane slow axis of the optically anisotropic layer B was orthogonal to the rotation axis of the rubbing rollers and was 75° when the longitudinal direction of the film was set at 90° (the width direction of the film was set at 0°).

Composition of Coating Liquid B-18 for Optically Anisotropic Layer

| | |
|---|---|
| Rod-like liquid crystal compound 2 | 80 parts by mass |
| Rod-like liquid crystal compound 3 | 20 parts by mass |
| Photopolymerization initiator (IRGACURE 907, manufactured by BASF) | 3 parts by mass |
| Sensitizer (KAYACURE DETX, manufactured by NIPPON KAYAKU CO., LTD.) | 1 part by mass |
| Fluorine-containing compound 4 | 0.3 parts by mass |
| Methyl ethyl ketone | 193 parts by mass |

Fluorine-containing compound 4

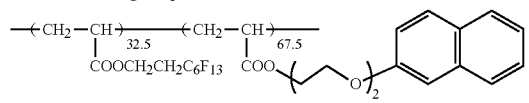

<Preparation of Circularly Polarizing Plate 18>

A first optically anisotropic layer was formed on the polarizer in the same procedure as in the preparation of the circularly polarizing plate 3 by subjecting the surface of the polarizing plate 01 on the side close to the polarizer to a rubbing treatment in a direction parallel with the absorption axis of the polarizer and applying the coating liquid A-2 for an optically anisotropic layer to the rubbed surface. The surface of the polarizing plate 01 on the side close to the first optically anisotropic layer was continuously laminated with the surface of the optically anisotropic layer A of a peelable support A-18 using an adhesive and simultaneously the above peelable support was peeled off between the cellulose acylate film and the alignment film. At this time, the direction of the absorption axis of the polarizer matched with the longitudinal direction of the polarizing plate and the angle formed between the absorption axis of the polarizer and the in-plane slow axis of the optically anisotropic layer A was 75°.

Next, the surface of the polarizing plate 01 on the side close to the optically anisotropic layer A was continuously laminated with the surface of the optically anisotropic layer B of the peelable support B-18 using an adhesive and simultaneously the above peelable support was peeled off between the cellulose acylate film and the alignment film. At this time, the direction of the absorption axis of the polarizer matched with the longitudinal direction of the polarizing plate and the angle formed between the absorption axis of the polarizer and the in-plane slow axis of the optically anisotropic layer B was 15°. The angle formed between the in-plane slow axis of the optically anisotropic layer A and the in-plane slow axis of the optically anisotropic layer B was 60°.

Further, a peelable support C-6 on which the second optically anisotropic layer was formed was prepared in the same procedure as in the preparation of the circularly polarizing plate 6. The surface of the polarizing plate 01 on the side close to the optically anisotropic layer B was continuously laminated with the surface of the optically anisotropic layer of the peelable support C-6 using an adhesive and simultaneously the above peelable support was peeled off between the cellulose acylate film and the alignment film. In this manner, a circularly polarizing plate 18 was prepared.

A laminate of the optically anisotropic layer A and the optically anisotropic layer B corresponds to a so-called broadband λ/4 plate. In the case in which the laminate of the optically anisotropic layer A and the optically anisotropic layer B is considered as one λ/4 plate, the angle formed between the in-plane slow axis of the λ/4 plate and the absorption axis of the polarizer was 45°.

Comparative Example 1

<Preparation of Circularly Polarizing Plate 21>

A polarizing plate 01 was prepared in the same procedure as in the preparation of the circularly polarizing plate 1. The surface of the polarizing plate 01 on the side close to the polarizer was subjected to a rubbing treatment in a 45° direction with respect to the absorption axis of the polarizer and the coating liquid B-1 for an optically anisotropic layer was applied to the surface in the same procedure as in Example 1 to form a λ/4 plate. Next, the coating liquid C-3 for an optically anisotropic layer was applied to the surface in the same procedure as in Example 3 to form a second optically anisotropic layer. Thus, a circularly polarizing plate 21 was prepared.

In Comparative Example 1, the first optically anisotropic layer was not included.

Comparative Example 2

<Preparation of Circularly Polarizing Plate 22>

A circularly polarizing plate 22 was prepared in the same procedure as in Example 1 except that the surface of the polarizing plate 01 on the side close to the polarizer was subjected to a rubbing treatment in a direction vertical to the absorption axis of the polarizer and the coating liquid A-1 for an optically anisotropic layer was applied to the rubbed surface.

Comparative Example 3

<Preparation of Circularly Polarizing Plate 23>

A circularly polarizing plate 23 was prepared in the same procedure as in Example 3 except that the surface of the polarizing plate 01 on the side close to the polarizer was subjected to a rubbing treatment in a direction orthogonal to the absorption axis of the polarizer and a first optically anisotropic layer was formed on the rubbed surface.

Comparative Example 4

<Preparation of Circularly Polarizing Plate 24>

A circularly polarizing plate 24 was prepared in the same procedure as in Example 11 except that the surface of the polarizing plate 01 on the side close to the polarizer was subjected to a rubbing treatment in a direction parallel with the absorption axis of the polarizer.

Comparative Example 5

<Preparation of Circularly Polarizing Plate 25>

A circularly polarizing plate 25 was prepared in the same procedure as in Comparative Example 1 except that in the formation of the λ/4 plate, the thickness of the coating film was changed.

Comparative Example 6

<Preparation of Circularly Polarizing Plate 26>
A circularly polarizing plate 26 was prepared in the same procedure as in Comparative Example 1 except that in the formation of the λ/4 plate, the thickness of the coating film was changed.

Comparative Example 7

<Preparation of Circularly Polarizing Plate 27>
A circularly polarizing plate 27 was prepared in the same procedure as in Comparative Example 1 except that the second optically anisotropic layer was not formed. The circularly polarizing plate 27 corresponds to the embodiment disclosed in JP1997-127885A (JP-H09-127885A).

Comparative Example 8

<Preparation of Circularly Polarizing Plate 28>
A circularly polarizing plate 28 was prepared in the same procedure as in Example 18 except that except that the first optically anisotropic layer was not formed in the preparation of Example 18. That is, the circularly polarizing plate 28 is a polarizing plate in which the optically anisotropic layer A, the optically anisotropic layer B, and the second optically anisotropic layer were formed sequentially on the polarizer of the polarizing plate 01.
<Mounting on Organic EL Display Panel and Evaluation of Display Performance>
(Mounting on Organic EL Display Panel)
An organic EL panel-mounted GALAXY S IV manufactured by SAMSUNG ELECTRONICS CO., LTD. was analyzed. The circularly polarizing plate was peeled off and each of the circularly polarizing plates in Examples 1 to 18 and Comparative Examples 1 to 8 was laminated on the organic EL display panel to prepare an organic EL display device.
(Evaluation of Display Performance) With respect to the prepared organic EL display device, visibility and display quality were evaluated under bright light. In a black display mode in which reflected light of external light is most easily visible, the reflected light when the display device was lit by a fluorescent lamp from a front direction and a polar angle of 45 degrees was observed. The display quality in the front direction and the viewing angle direction (a polar angle of 45 degrees) was evaluated based on the following criteria. The results are collectively shown in Table 3.
4: The reflected light is slightly visible but tinting is not visible (allowable).
3: The reflected light is slightly visible but tinting is not noticeable (allowable).
2: The reflected light is visible and tinting is noticeable, which are not allowable.
1: The reflected light is remarkably visible and is not allowable.

In Table 3, the column of "dispersion" represents "forward" in the case in which the first optically anisotropic layer (or the second optically anisotropic layer) exhibits forward wavelength dispersibility and represents "reverse" in the case in which the first optically anisotropic layer (or the second optically anisotropic layer) exhibits reverse wavelength dispersibility.

In Table 3, the column of "angle (°) with respect to absorption axis of polarizer" represents an angle formed between the in-plane slow axis of the first optically anisotropic layer (or the λ/4 plate, the optically anisotropic layer A, or the optically anisotropic layer B) and the absorption axis of the polarizer.

In Table 3, the column of "Re wavelength dispersion (450/550)" represents a ratio (Re(450)/Re(550)) between Re(450) and Re(550) which are in-plane retardation values of the first optically anisotropic layer (or the λ/4 plate, the optically anisotropic layer A, or the optically anisotropic layer B) measured at wavelengths of 450 nm and 550 nm.

In Table 3, the column of "Re wavelength dispersion (650/550)" represents a ratio (Re(650)/Re(550)) between Re(650) and Re(550) which are in-plane retardation values of the first optically anisotropic layer (or the λ/4 plate, the optically anisotropic layer A, or the optically anisotropic layer B) measured at wavelengths of 650 nm and 550 nm.

In Table 3, the column of "Re (nm)" represents an in-plane retardation value of the first optically anisotropic layer (or the λ/4 plate, the second optically anisotropic layer, the optically anisotropic layer A, or the optically anisotropic layer B) measured at a wavelength of 550 nm.

In Table 3, the column of "Rth(nm)" represents the retardation value of the first optically anisotropic layer (or the λ/4 plate, the second optically anisotropic layer, the optically anisotropic layer A, or the optically anisotropic layer B) in the thickness direction measured at a wavelength of 550 nm.

In Table 3, the column of "Rth wavelength dispersion (450/550)" represents a ratio (Rth(450)/Rth(550)) between Rth(450) and Rth(550) which are retardation values of the second optically anisotropic layer in the thickness direction measured at wavelengths of 450 nm and 550 nm.

In Table 3, the column of "Rth wavelength dispersion (650/550)" represents a ratio (Rth(650)/Rth(550)) between Rth(650) and Rth(550) which are retardation values of the second optically anisotropic layer in the thickness direction measured at wavelengths of 650 nm and 550 nm.

In Table 3, in the column of "Whether or not relationship of Equation (Y) is satisfied", the case in which the above-described relationship of Equation (Y) is satisfied is expressed as "A" and the case in which the above-described relationship is not satisfied is expressed as "B".

TABLE 3

(Part 1)

| | | Polarizer Film thickness (μm) | First optically anisotropic layer | | | | | | | λ/4 plate | | |
|---|---|---|---|---|---|---|---|---|---|---|---|---|
| | | | Dispersion | Angle with respect to absorption axis of polarizer (°) | Re (nm) | Rth (nm) | Re wavelength dispersion (450550) | Re wavelength dispersion (650550) | Nz factor | Angle with respect to absorption axis of polarizer (°) | Re (nm) | Rth (nm) |
| Example 1 | Circularly polorizing plate 1 | 15 | Reverse | 0 | 250 | 125 | 0.77 | 1.05 | 1.0 | 45 | 138 | 69 |

TABLE 3-continued (Part 1)

| | | | | | | | | | | | | |
|---|---|---|---|---|---|---|---|---|---|---|---|---|
| Example 2 | Circularly polorizing plate 2 | 15 | Forward | 0 | 250 | 125 | 1.09 | 0.97 | 1.0 | 45 | 138 | 69 |
| Example 3 | Circularly polorizing plate 3 | 15 | Forward | 0 | 250 | 125 | 1.09 | 0.97 | 1.0 | 45 | 138 | 69 |
| Example 4 | Circularly polorizing plate 4 | 15 | Forward | 0 | 250 | 125 | 1.09 | 0.97 | 1.0 | 45 | 138 | 69 |
| Example 5 | Circularly polorizing plate 5 | 15 | Forward | 0 | 250 | 125 | 1.09 | 0.97 | 1.0 | 45 | 138 | 69 |
| Example 6 | Circularly polorizing plate 6 | 15 | Forward | 0 | 250 | 125 | 1.09 | 0.97 | 1.0 | 45 | 138 | 69 |
| Example 7 | Circularly polorizing plate 7 | 15 | Forward | 0 | 250 | 125 | 1.09 | 0.97 | 1.0 | 45 | 138 | 69 |
| Example 8 | Circularly polorizing plate 8 | 15 | Forward | 0 | 450 | 225 | 1.09 | 0.97 | 1.0 | 45 | 138 | 69 |
| Example 9 | Circularly polorizing plate 9 | 15 | Forward | 0 | 100 | 50 | 1.09 | 0.97 | 1.0 | 45 | 138 | 69 |
| Example 10 | Circularly polorizing plate 10 | 8 | Forward | 0 | 250 | 125 | 1.09 | 0.97 | 1.0 | 45 | 138 | 69 |
| Example 11 | Circularly polorizing plate 11 | 15 | Forward | 90 | 250 | −125 | 1.19 | 0.94 | 0.0 | 45 | 138 | 69 |
| Example 12 | Circularly polorizing plate 12 | 15 | Forward | 90 | 250 | −125 | 1.19 | 0.94 | 0.0 | 45 | 138 | 69 |
| Example 13 | Circularly polorizing plate 13 | 15 | Forward | 0 | 250 | 125 | 1.09 | 0.97 | 1.0 | 45 | 125 | 63 |
| Example 14 | Circularly polorizing plate 14 | 15 | Forward | 0 | 250 | 125 | 1.09 | 0.97 | 1.0 | 45 | 150 | 75 |
| Example 15 | Circularly polorizing plate 15 | 15 | Forward | 90 | 250 | −125 | 1.19 | 0.94 | 0.0 | 45 | 125 | 63 |
| Example 16 | Circularly polorizing plate 16 | 15 | Forward | 90 | 250 | −125 | 1.19 | 0.94 | 0.0 | 45 | 150 | 75 |
| Example 17 | Circularly polorizing plate 17 | 15 | Forward | 0 | 250 | 125 | 1.09 | 0.97 | 1.0 | 45 | 138 | 69 |
| Comparative Example 1 | Circularly polarizing plate 21 | 15 | — | — | — | — | — | — | — | 45 | 138 | 69 |
| Comparative Example 2 | Circularly polarizing plate 22 | 15 | Reverse | 90 | 250 | 125 | 0.77 | 1.05 | 1.0 | 45 | 138 | 69 |
| Comparative Example 3 | Circularly polarizing plate 23 | 15 | Forward | 90 | 250 | 125 | 1.09 | 0.97 | 1.0 | 45 | 138 | 69 |
| Comparative Example 4 | Circularly polarizing plate 24 | 15 | Forward | 0 | 250 | −125 | 1.19 | 0.94 | 0.0 | 45 | 138 | 69 |
| Comparative Example 5 | Circularly polarizing plate 25 | 15 | — | — | — | — | — | — | — | 45 | 125 | 63 |
| Comparative Example 6 | Circularly polarizing plate 26 | 15 | — | — | — | — | — | — | — | 45 | 150 | 75 |
| Comparative Example 7 | Circularly polarizing plate 27 | 15 | — | — | — | — | — | — | — | 45 | 138 | 69 |

TABLE 3-continued (Part 1)

| | | λ/4 plate | | Second optically anisotropic layer | | | | | Whether or not relationship of Equation (Y) is satisfied | Display performance (visibility of reflected light) | |
| | | Re wavelength dispersion (450/550) | Re wavelength dispersion (650/550) | Dispersion | Re (nm) | Rth (nm) | Rth wavelength dispersion (450/550) | Rth wavelength dispersion (650/550) | | Front direction | Viewing angle direction |
|---|---|---|---|---|---|---|---|---|---|---|---|
| Example 1 | Circularly polorizing plate 1 | 0.77 | 1.05 | Reverse | 0.1 | −65 | 0.77 | 1.05 | A | 4 | 4 |
| Example 2 | Circularly polorizing plate 2 | 0.77 | 1.05 | Reverse | 0.1 | −65 | 0.77 | 1.05 | A | 4 | 4 |
| Example 3 | Circularly polorizing plate 3 | 0.77 | 1.05 | Forward | 0.1 | −65 | 1.09 | 0.97 | A | 4 | 4 |
| Example 4 | Circularly polorizing plate 4 | 0.77 | 1.05 | Forward | 0.1 | −30 | 1.09 | 0.97 | A | 4 | 3 |
| Example 5 | Circularly polorizing plate 5 | 0.77 | 1.05 | Forward | 0.1 | −100 | 1.09 | 0.97 | A | 4 | 3 |
| Example 6 | Circularly polorizing plate 6 | 0.84 | 1.04 | Forward | 0.1 | −65 | 1.09 | 0.97 | A | 4 | 4 |
| Example 7 | Circularly polorizing plate 7 | 0.88 | 1.03 | Forward | 0.1 | −65 | 1.09 | 0.97 | A | 4 | 3 |
| Example 8 | Circularly polorizing plate 8 | 0.77 | 1.05 | Forward | 0.1 | −65 | 1.09 | 0.97 | A | 4 | 3 |
| Example 9 | Circularly polorizing plate 9 | 0.77 | 1.05 | Forward | 0.1 | −65 | 1.09 | 0.97 | A | 4 | 3 |
| Example 10 | Circularly polorizing plate 10 | 0.77 | 1.05 | Forward | 0.1 | −65 | 1.09 | 0.97 | A | 4 | 4 |
| Example 11 | Circularly polorizing plate 11 | 0.77 | 1.05 | Forward | 0.1 | −65 | 1.09 | 0.97 | A | 4 | 4 |
| Example 12 | Circularly polorizing plate 12 | 0.88 | 1.03 | Forward | 0.1 | −65 | 1.09 | 0.97 | A | 4 | 3 |
| Example 13 | Circularly polorizing plate 13 | 0.77 | 1.05 | Forward | 0.1 | −65 | 1.09 | 0.97 | A | 3 | 3 |
| Example 14 | Circularly polorizing plate 14 | 0.77 | 1.05 | Forward | 0.1 | −65 | 1.09 | 0.97 | A | 3 | 3 |
| Example 15 | Circularly polorizing plate 15 | 0.77 | 1.05 | Forward | 0.1 | −65 | 1.09 | 0.97 | A | 3 | 3 |
| Example 16 | Circularly polorizing plate 16 | 0.77 | 1.05 | Forward | 0.1 | −65 | 1.09 | 0.97 | A | 3 | 3 |
| Example 17 | Circularly polorizing plate 17 | 0.77 | 1.05 | — | — | — | — | — | A | 4 | 3 |
| Comparative Example 1 | Circularly polorizing plate 21 | 0.77 | 1.05 | Forward | 0.1 | −65 | 1.09 | 0.97 | — | 4 | 2 |
| Comparative Example 2 | Circularly polorizing plate 22 | 0.77 | 1.05 | Reverse | 0.1 | −65 | 0.77 | 1.05 | A | 4 | 1 |
| Comparative Example 3 | Circularly polorizing plate 23 | 0.77 | 1.05 | Forward | 0.1 | −65 | 1.09 | 0.97 | A | 4 | 1 |
| Comparative Example 4 | Circularly polorizing plate 24 | 0.77 | 1.05 | Forward | 0.1 | −65 | 1.09 | 0.97 | A | 4 | 1 |
| Comparative Example 5 | Circularly polorizing plate 25 | 0.77 | 1.05 | Forward | 0.1 | −65 | 1.09 | 0.97 | — | 3 | 1 |
| Comparative Example 6 | Circularly polorizing plate 26 | 0.77 | 1.05 | Forward | 0.1 | −65 | 1.09 | 0.97 | — | 3 | 1 |

TABLE 3-continued (Part 1)

| | | | | | | | | | | | |
|---|---|---|---|---|---|---|---|---|---|---|---|
| Comparative Example 7 | Circularly polarizing plate 27 | 0.77 | 1.05 | — | — | — | — | — | — | — | 4 | 1 |

TABLE 4

(Part 2)

| | | | First optically anisotropic layer | | | | | | | Optically Anisotropic Layer A | |
|---|---|---|---|---|---|---|---|---|---|---|---|
| | | Polarizer Film thickness (μm) | Dispersion | Angle with respect to absorption axis of polarizer (°) | Re (nm) | Rth (nm) | Re wavelength dispersion (450550) | Re wavelength dispersion (650550) | Nz factor | Angle with respect to absorption axis of polarizer (°) | Re (nm) |
| Example 18 | Circularly polorizing plate 18 | 15 | Forward | 0 | 250 | 125 | 1.09 | 0.97 | 1.0 | 75 | 240 |
| Comparative Example 28 | Circularly polorizing plate 28 | 15 | — | — | — | — | — | — | — | 75 | 240 |

| | | Optically Anisotropic Layer A | | | Angle with respect to absorption axis of polarizer (°) | Optically Anisotropic Layer B | | | |
|---|---|---|---|---|---|---|---|---|---|
| | | Rth (nm) | Re wavelength dispersion (450550) | Re wavelength dispersion (650550) | | Re (nm) | Rth (nm) | Re wavelength dispersion (450550) | Re wavelength dispersion (650550) |
| Example 18 | Circularly polorizing plate 18 | −130 | 1.09 | 0.96 | 15 | 115 | 58 | 1.09 | 0.97 |
| Comparative Example 28 | Circularly polorizing plate 28 | −120 | 1.09 | 0.95 | 15 | 115 | 58 | 1.09 | 0.97 |

| | | Second optically anisotropic layer | | | | | Whether or not relationship of Equation (Y) is satisfied | Display performance (visibility of reflected light) | |
|---|---|---|---|---|---|---|---|---|---|
| | | Dispersion | Re (nm) | Rth (nm) | Rh wavelength dispersion (450550) | Rh wavelength dispersion (650550) | | Front direction | Viewing angle direction |
| Example 18 | Circularly polorizing plate 18 | Forward | 0.1 | −65 | 1.09 | 0.97 | A | 4 | 4 |
| Comparative Example 28 | Circularly polorizing plate 28 | Forward | 0.1 | −65 | 1.09 | 0.97 | — | 4 | 2 |

As shown in Table 3, in the organic EL display devices of the present invention, reflected light of external light and tinting were suppressed not only when viewed from the front direction but also when viewed from the tilted direction.

Particularly, it was confirmed that in comparison of Examples 3 to 5, in the case in which Rth(550) of the second optically anisotropic layer is −90 to −40 nm, further excellent effect is obtained.

It was confirmed that in comparison of Examples 3, 8, and 9, in the case in which Re(550) of the first optically anisotropic layer is 200 to 300 nm, further excellent effect is obtained.

It was confirmed that in comparison of Examples 3, 13, and 14, in the case in which Re(550) of the λ/4 plate is 130 to 145 nm, further excellent effect is obtained.

It was confirmed that in comparison of Examples 3 and 17, in the case in which the second optically anisotropic layer is provided, further excellent effect is obtained.

It was confirmed that in comparison of Examples 6 and 7, Re(450)/Re(550) of the λ/4 plate is 0.86 or less, further excellent effect is obtained.

On the other hand, Comparative Examples 1, and 5 to 7 in which the first optically anisotropic layer is not provided, and Comparative Examples 2 to 4 in which the relationship between the in-plane slow axis of the first optically anisotropic layer and the absorption axis of the polarizer (being parallel or orthogonal to each other) is not satisfied, desired effect was not obtained.

EXPLANATION OF REFERENCES 10, 110, 210, 310: organic EL display device
12: polarizer
14A, 14B: First optically anisotropic layer
16: λ/4 plate
18: organic EL display panel
20: second optically anisotropic layer

What is claimed is:

1. An organic EL display device comprising:
   a polarizer;
   a first optically anisotropic layer;
   a λ/4 plate; and
   an organic EL display panel in this order from a viewing side,
   wherein an angle formed between an absorption axis of the polarizer and an in-plane slow axis of the λ/4 plate is within a range of 45±3°,
   an Nz factor of the first optically anisotropic layer is −0.1 or more and 1.1 or less,
   in a case in which the Nz factor of the first optically anisotropic layer is 0.5 or more and 1.1 or less, the polarizer and the first optically anisotropic layer are arranged such that the absorption axis of the polarizer is parallel with the in-plane slow axis of the first optically anisotropic layer,
   in a case in which the Nz factor of the first optically anisotropic layer is −0.1 or more and less than 0.5, the polarizer and the first optically anisotropic layer are arranged such that the absorption axis of the polarizer is orthogonal to the in-plane slow axis of the first optically anisotropic layer, and
   Re(550), which is an in-plane retardation value of the first optically anisotropic layer measured at a wavelength of 550 nm, satisfies the following Equation (X):

$$100 \text{ nm} \leq Re(550) \leq 450 \text{ nm}, \quad \text{Equation (X)}$$

further comprising:
   a second optically anisotropic layer between the λ/4 plate and the organic EL display panel,
   wherein Re(550), which is an in-plane retardation value of the second optically anisotropic layer measured at a wavelength of 550 nm, is 0 to 10 nm, and
   wherein Rth(550), which is a retardation value of the second optically anisotropic layer in a thickness direction measured at a wavelength of 550 nm, is −90 to −40 nm.

2. The organic EL display device according to claim 1, wherein an average refractive index of the first optically anisotropic layer and an average refractive index of the polarizer satisfy a relationship of the following Equation (Y):

$$\text{Average refractive index of first optically anisotropic layer} - \text{Average refractive index of polarizer} \geq 0.03. \quad \text{Equation (Y)}$$

3. The organic EL display device according to claim 1, wherein the first optically anisotropic layer includes a liquid crystal compound.

4. The organic EL display device according to claim 1, wherein the Nz factor of the first optically anisotropic layer is 0.5 or more and 1.1 or less.

5. The organic EL display device according to claim 4, wherein the first optically anisotropic layer includes a rod-like liquid crystal compound.

6. The organic EL display device according to claim 1, wherein the Nz factor of the first optically anisotropic layer is −0.1 or more and less than 0.5.

7. The organic EL display device according to claim 6, wherein the first optically anisotropic layer includes a disk-like liquid crystal compound.

8. The organic EL display device according to claim 1, wherein the λ/4 plate exhibits reverse wavelength dispersibility.

9. The organic EL display device according to claim 1, wherein the λ/4 plate includes a liquid crystal compound.

10. The organic EL display device according to claim 2, wherein the first optically anisotropic layer includes a liquid crystal compound.

11. The organic EL display device according to claim 2, wherein the Nz factor of the first optically anisotropic layer is 0.5 or more and 1.1 or less.

12. The organic EL display device according to claim 3, wherein the Nz factor of the first optically anisotropic layer is 0.5 or more and 1.1 or less.

13. The organic EL display device according to claim 10, wherein the Nz factor of the first optically anisotropic layer is 0.5 or more and 1.1 or less.

14. The organic EL display device according to claim 2, wherein the Nz factor of the first optically anisotropic layer is −0.1 or more and less than 0.5.

15. The organic EL display device according to claim 3, wherein the Nz factor of the first optically anisotropic layer is −0.1 or more and less than 0.5.

16. The organic EL display device according to claim 10, wherein the Nz factor of the first optically anisotropic layer is −0.1 or more and less than 0.5.

17. The organic EL display device according to claim 2, wherein the λ/4 plate exhibits reverse wavelength dispersibility.

18. The organic EL display device according to claim 3, wherein the λ/4 plate exhibits reverse wavelength dispersibility.

19. The organic EL display device according to claim 4, wherein the λ/4 plate exhibits reverse wavelength dispersibility.

* * * * *